(12) United States Patent
Seki

(10) Patent No.: US 11,264,353 B2
(45) Date of Patent: Mar. 1, 2022

(54) SWITCH MODULE

(71) Applicant: Murata Manufacturing Co., Ltd., Kyoto (JP)

(72) Inventor: Kenta Seki, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/923,516

(22) Filed: Jul. 8, 2020

(65) Prior Publication Data

US 2020/0343214 A1    Oct. 29, 2020

Related U.S. Application Data

(63) Continuation of application No. PCT/JP2018/048126, filed on Dec. 27, 2018.

(30) Foreign Application Priority Data

Jan. 11, 2018 (JP) .............................. JP2018-002603

(51) Int. Cl.
*H01L 23/00* (2006.01)
*H03K 17/693* (2006.01)
*H04B 1/48* (2006.01)

(52) U.S. Cl.
CPC .............. *H01L 24/49* (2013.01); *H01L 24/48* (2013.01); *H01L 24/73* (2013.01); *H03K 17/693* (2013.01);
(Continued)

(58) Field of Classification Search
CPC ................................ H01L 24/49; H01L 23/66
See application file for complete search history.

(56) References Cited

U.S. PATENT DOCUMENTS

| 8,654,542 B2 | 2/2014 | Murase et al. |
| 2003/0164536 A1 | 9/2003 | Hirata et al. |

(Continued)

FOREIGN PATENT DOCUMENTS

| JP | H1 1219647 A | 8/1999 |
| JP | 2003258188 A | 9/2003 |

(Continued)

OTHER PUBLICATIONS

International Search Report issued in Application No. PCT/JP2018/048126, dated Mar. 19, 2019.

(Continued)

*Primary Examiner* — Yu-Hsi D Sun
(74) *Attorney, Agent, or Firm* — Pearne & Gordon LLP

(57) ABSTRACT

A switch module (1) includes RF input/output wires (51a, 51c) connecting RF input/output pad electrodes (11a, 11c) and RF input/output lead electrodes (31a, 31c), control signal wires (52a, 52b) connecting control-signal pad electrodes (12a, 12b) and control-signal lead electrodes (32a, 32b), and a ground wire (53a) connected to a ground pad electrode (13a). The control-signal pad electrodes (12a, 12b), the control-signal lead electrodes (32a, 32b), and the control signal wires (52a, 52b) are disposed in a region (a2) on the opposite side, with respect to a boundary defined by a linear line (L1) along an extension direction of the ground wire (53a), to a region (a1) in which the RF input/output wire (51a), the RF input/output pad electrode (11a), and the RF input/output lead electrode (31a) are disposed.

20 Claims, 12 Drawing Sheets

(52) U.S. Cl.
CPC ............... *H01L 2224/4813* (2013.01); *H01L 2224/48227* (2013.01); *H01L 2224/49112* (2013.01); *H01L 2224/49171* (2013.01); *H01L 2224/73265* (2013.01); *H04B 1/48* (2013.01)

(56) References Cited

U.S. PATENT DOCUMENTS

| | | |
|---|---|---|
| 2003/0183928 A1 | 10/2003 | Miyazawa |
| 2014/0339689 A1 | 11/2014 | Murase et al. |
| 2017/0303400 A1* | 10/2017 | Frenette ............... H01L 24/48 |
| 2020/0211998 A1* | 7/2020 | Uejima ............... H01L 23/552 |
| 2020/0294996 A1* | 9/2020 | Miyazaki ............. H01L 27/088 |

FOREIGN PATENT DOCUMENTS

| | | | |
|---|---|---|---|
| JP | 2003298305 A | 10/2003 | |
| JP | 2005136887 A | 5/2005 | |
| WO | 2010106977 A1 | 9/2010 | |
| WO | 2013125362 A1 | 8/2013 | |

OTHER PUBLICATIONS

Written Opinion issued in Application No. PCT/JP2018/048126, dated Mar. 19, 2019.

\* cited by examiner

SWITCH MODULE

This is a continuation of International Application No. PCT/JP2018/048126 filed on Dec. 27, 2018 which claims priority from Japanese Patent Application No. 2018-002603 filed on Jan. 11, 2018. The contents of these applications are incorporated herein by reference in their entireties.

BACKGROUND OF THE DISCLOSURE

Field of the Disclosure

The present disclosure relates to a switch module in which a semiconductor chip including a switch circuit is mounted to a substrate.

Description of the Related Art

Hitherto, there is known a radio frequency module in which a semiconductor chip is mounted to a substrate. Patent Document 1 discloses, as an example of that type of radio frequency module, a switch module that includes a semiconductor chip including a switch circuit, a substrate to which the semiconductor chip is mounted, and a plurality of bonding wires connecting a plurality of electrodes on the semiconductor chip and a plurality of electrodes on the substrate.

In the switch module disclosed in Patent Document 1, a bonding wire connected to a ground is disposed in part of a region between the bonding wire connected to an electrode (OUT2) from which an RF signal (radio frequency signal) is outputted and the bonding wire connected to an electrode (Ctl-2) to which a control signal is inputted. The bonding wire connected to the ground is intended to ensure isolation between the electrode from which the RF signal is outputted and the electrode to which the control signal is inputted.

Patent Document 1: Japanese Unexamined Patent Application Publication No. 2003-258188

BRIEF SUMMARY OF THE DISCLOSURE

In the switch module disclosed in Patent Document 1, however, the electrode (Ctl-2) to which the control signal is inputted is arranged to partly protrude into a region where the electrode (OUT2) from which the RF signal is outputted is disposed, the region being positioned on one side of a linear line extending in an extension direction of the above-mentioned bonding wire connected to the ground. Therefore, it is difficult to stably maintain isolation between the electrode from which an RF signal is outputted and the electrode to which the control signal is inputted. Thus, a control circuit handling the control signal and a switch circuit handling the RF signal affect each other, whereby isolation between the switch circuit and the control circuit reduces.

In view of the above-described state of the art, an object of the present disclosure is to provide a switch module that can suppress reduction of the isolation of the electrode and the bonding wire through which the RF signal is inputted and outputted from the electrode and the bonding wire through which the control signal is inputted, and that can enhance the isolation between the switch circuit and the control circuit.

To achieve the above object, an embodiment of the present disclosure provides a switch module including a semiconductor chip that includes a switch circuit and a control circuit controlling the switch circuit, and a substrate to which the semiconductor chip is mounted, wherein two or more RF input/output lead electrodes through which RF signals are inputted and outputted, and a control-signal lead electrode through which a control signal is inputted are provided on or in a principal surface of the substrate, wherein two or more RF input/output pad electrodes through which the RF signals are inputted and outputted, a control-signal pad electrode through which the control signal is inputted, and a ground pad electrode connected to a ground are provided on or in a top surface of the semiconductor chip, wherein the RF input/output pad electrodes are connected to the switch circuit, wherein the control-signal pad electrode and the ground pad electrode are connected to the control circuit, wherein the switch module further includes two or more RF input/output wires that are bonding wires connecting the two or more RF input/output pad electrodes and the two or more RF input/output lead electrodes in a one-to-one relation; a control signal wire that is a bonding wire connecting the control-signal pad electrode and the control-signal lead electrode; and a ground wire that is a bonding wire connected to the ground pad electrode, and wherein, when looking at the switch module from the principal surface side of the substrate, the control-signal pad electrode, the control-signal lead electrode, and the control signal wire are disposed in a region on the opposite side, with respect to a boundary defined by a linear line along an extension direction of the ground wire, to a region in which at least one of the two or more RF input/output wires, the RF input/output pad electrode connected to the at least one RF input/output wire, and the RF input/output lead electrode connected to the at least one RF input/output wire are disposed.

A ground lead electrode connected to the ground may be further provided on or in the principal surface of the substrate, and the ground wire may connect the ground pad electrode and the ground lead electrode.

With the switch module having the above-described structure, the switch module can suppress reduction of isolation of the RF input/output pad electrode, the RF input/output lead electrode, and the RF input/output wire through each of which the RF signal is inputted and outputted, from the control-signal pad electrode, the control-signal lead electrode, and the control signal wire through each of which the control signal is inputted. Accordingly, isolation between the switch circuit and the control circuit can be enhanced.

To achieve the above object, another embodiment of the present disclosure provides a switch module including a semiconductor chip that includes a switch circuit and a control circuit controlling the switch circuit, and a substrate to which the semiconductor chip is mounted, wherein two or more RF input/output lead electrodes through which RF signals are inputted and outputted, and a control-signal lead electrode through which a control signal is inputted are provided on or in a principal surface of the substrate, wherein two or more RF input/output pad electrodes through which the RF signals are inputted and outputted, a control-signal pad electrode through which the control signal is inputted, and one or more ground pad electrodes connected to the ground are provided on or in a top surface of the semiconductor chip, wherein the RF input/output pad electrodes are connected to the switch circuit, wherein the control-signal pad electrode and the ground pad electrodes are connected to the control circuit, wherein the switch module further includes two or more RF input/output wires that are bonding wires connecting the two or more RF input/output pad electrodes and the two or more RF input/output lead electrodes in a one-to-one relation; a control signal wire that is a bonding wire connecting the control-signal pad electrode and the control-signal lead electrode; and two or more ground wires that are bonding wires connected to the one or more ground pad electrodes, and wherein, when looking at the switch module from the principal surface side of the substrate, the control-signal pad electrode, the control-signal lead electrode, and the control signal wire are disposed in a second region that is one of regions on the switch module when viewed from the principal surface side, the regions being partitioned by two or more linear lines along extension directions of the two or more ground wires, the second region being different from a first region in which at least one of the two or more RF input/output wires, the RF input/output pad electrode connected to the at least one RF input/output wire, and the RF input/output lead electrode connected to the at least one RF input/output wire are disposed.

Two or more ground lead electrodes connected to the ground may be further provided on or in the principal surface of the substrate, and the two or more ground wires may connect the ground pad electrodes and the two or more ground lead electrodes in a one-to-one relation.

With the switch module having the above-described structure, the switch module can suppress reduction of the isolation of the RF input/output pad electrode, the RF input/output lead electrode, and the RF input/output wire through each of which the RF signal is inputted and outputted, from the control-signal pad electrode, the control-signal lead electrode, and the control signal wire through each of which the control signal is inputted. Accordingly, the isolation between the switch circuit and the control circuit can be enhanced.

The switch circuit may include a plurality of switches each having one terminal and the other terminal, the other terminals of the plurality of switches may not be connected to each other, the one terminals of the plurality of switches may be connected to each other, the number of the RF input/output pad electrodes may be three or more, one of the three or more RF input/output pad electrodes may be connected to the one terminal side of the plurality of switches, two or more of the three or more RF input/output pad electrodes, the two or more RF input/output pad electrodes being not connected to the one terminal side of the plurality of switches, may be connected respectively to the other terminals of the plurality of switches, the number of the RF input/output lead electrodes may be three or more, the number of the RF input/output wires may be three or more, and the three or more RF input/output wires may connect the three or more RF input/output pad electrodes and the three or more RF input/output lead electrodes in a one-to-one relation.

With the above-described feature, even in the case of the switch circuit having the plurality of switches, the switch module can suppress reduction of the isolation of the RF input/output pad electrode, the RF input/output lead electrode, and the RF input/output wire from the control-signal pad electrode, the control-signal lead electrode, and the control signal wire. Accordingly, the isolation between the switch circuit and the control circuit can be enhanced.

When looking at the switch module from the principal surface side of the substrate, at least one of the ground pad electrode and the ground wire may be disposed between the at least one RF input/output pad electrode and the control-signal pad electrode, between the at least one RF input/output lead electrode and the control-signal lead electrode, and between the at least one RF input/output wire and the control signal wire.

With the above-described feature, the switch module can further suppress reduction of the isolation between the RF input/output pad electrode and the control-signal pad electrode, the isolation between the RF input/output lead electrode and the control-signal lead electrode, and the isolation between the RF input/output wire and the control signal wire. Accordingly, the isolation between the switch circuit and the control circuit can be further enhanced.

A power-supply lead electrode connected to a power supply may be further provided on or in the principal surface of the substrate, a power-supply pad electrode connected to the power supply may be further provided on or in the top surface of the semiconductor chip, the power-supply pad electrode may be connected to the control circuit, the switch module may further include a power-supply wire that is a bonding wire connecting the power-supply pad electrode and the power-supply lead electrode, and, when looking at the switch module from the principal surface side of the substrate, the power-supply pad electrode, the power-supply lead electrode, and the power-supply wire may be disposed in the region on the opposite side.

With the switch module having the above-described structure, the switch module can additionally suppress reduction of isolation of the RF input/output pad electrode, the RF input/output lead electrode, and the RF input/output wire through each of which the RF signal is inputted and outputted, from the power-supply pad electrode, the power-supply lead electrode, and the power-supply wire each of which is connected to the power supply. Accordingly, influences of a power line can be further suppressed.

A power-supply lead electrode connected to a power supply may be further provided on or in the principal surface of the substrate, a power-supply pad electrode connected to the power supply may be further provided on or in the top surface of the semiconductor chip, the power-supply pad electrode may be connected to the control circuit, the switch module may further include a power-supply wire that is a bonding wire connecting the power-supply pad electrode and the power-supply lead electrode, and, when looking at the switch module from the principal surface side of the substrate, the power-supply pad electrode, the power-supply lead electrode, and the power-supply wire may be disposed in the second region.

With the switch module having the above-described structure, the switch module can additionally suppress reduction of the isolation of the RF input/output pad electrode, the RF input/output lead electrode, and the RF input/output wire through each of which the RF signal is inputted and outputted, from the power-supply pad electrode, the power-supply lead electrode, and the power-supply wire each of which is connected to the power supply. Accordingly, the influences of the power line can be further suppressed.

When looking at the switch module from the principal surface side of the substrate, at least one of the ground pad electrode and the ground wire may be disposed between the at least one RF input/output pad electrode and the power-supply pad electrode, between the at least one RF input/output lead electrode and the power-supply lead electrode, and between the at least one RF input/output wire and the power-supply wire.

With the above-described feature, the switch module can further suppress reduction of the isolation between the RF input/output pad electrode and the power-supply pad electrode, the isolation between the RF input/output lead electrode and the power-supply lead electrode, and the isolation between the RF input/output wire and the power-supply wire. Accordingly, the influences of the power line can be further suppressed.

When looking at the semiconductor chip from the top surface side, the semiconductor chip may have a rectangular shape, the control-signal pad electrode and the power-supply pad electrode may be arranged along one of four sides of the semiconductor chip, and at least one of the two or more RF input/output pad electrodes may be arranged along another side of the semiconductor chip different from the one side.

With the above-described arrangement, in the semiconductor chip, the RF input/output pad electrode can be arranged apart from the control-signal pad electrode and the power-supply pad electrode with a larger distance kept therebetween, and higher isolation can be ensured.

The two or more RF input/output pad electrodes may be all arranged along sides of the semiconductor chip other than the one side thereof when looking at the semiconductor chip from the top surface side.

With the above-described arrangement, in the semiconductor chip, the RF input/output pad electrodes can be each arranged apart from the control-signal pad electrode and the power-supply pad electrode with a larger distance kept therebetween, and higher isolation can be ensured.

When looking at the semiconductor chip from the top surface side, the ground pad electrode may be positioned on the inner side than any of at least one of the two or more RF input/output pad electrodes, the control-signal pad electrode, and the power-supply pad electrode.

With the above-described arrangement, in the semiconductor chip, the isolation of the RF input/output pad electrode from the control-signal pad electrode and the power-supply pad electrode can be ensured with the presence of the ground pad electrode.

A bottom surface electrode connected to the ground pad electrode may be provided on or in a bottom surface of the semiconductor chip, the semiconductor chip may be mounted to the substrate with a conductive bonding material, and the bottom surface electrode may be connected to the ground through the conductive bonding material.

With the above-described feature, a ground potential at the ground pad electrode can be stabilized, and the isolation of the RF input/output pad electrode from the control-signal pad electrode and the power-supply pad electrode can be ensured.

The bottom surface electrode may be connected to the ground through a wiring provided on or in the substrate.

With the above-described structure, a space occupied by the switch module can be reduced in comparison with that occupied in the case of having, for example, a structure in which the bottom surface electrode and the ground are not connected to each other on the substrate and are separately connected to the ground outside the switch module.

The two or more ground pad electrodes may be provided on or in the top surface of the semiconductor chip, and the two or more ground wires may be connected respectively to the two or more ground pad electrodes.

Alternatively, the two or more ground pad electrode may be provided on or in the top surface of the semiconductor chip, and the two or more ground wires may connect the two or more ground pad electrodes and the two or more ground lead electrodes in a one-to-one relation.

With the above-described features, the connection between the ground pad electrodes and the ground wires can be strengthened, and reduction of the isolation in the switch module can be suppressed with the aid of the ground pad electrodes and the ground wires.

According to the present disclosure, the switch module can be obtained which makes it more reliable to suppress reduction of the isolation of the electrode and the bonding wire through which the RF signal is inputted and outputted from the electrode and the bonding wire through which the control signal is inputted, and to enhance the isolation between the switch circuit and the control circuit.

DETAILED DESCRIPTION OF THE DISCLOSURE

Figure 1:
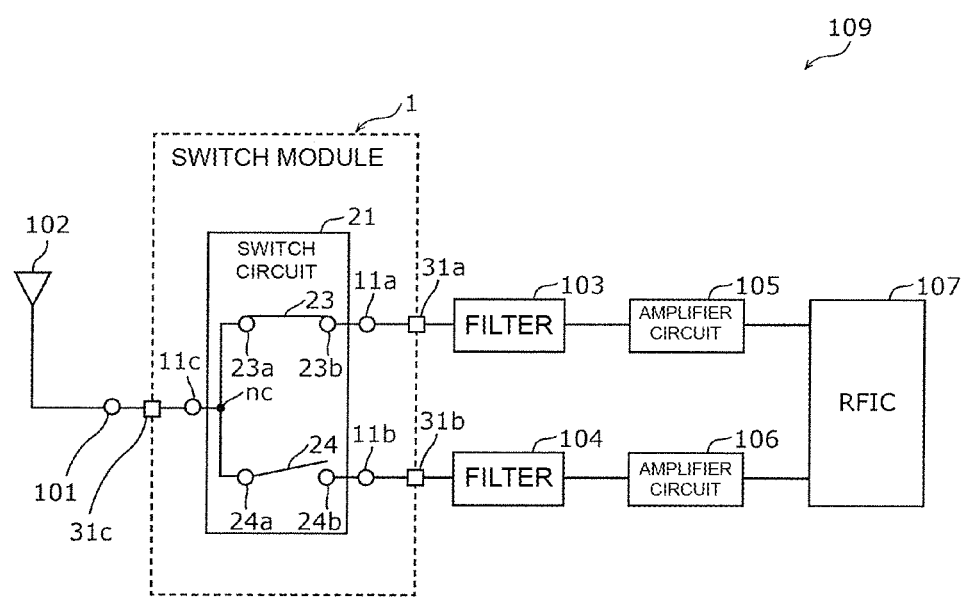
FIG. 1 is a circuit diagram of a communication device including a switch module according to Embodiment 1.

Switch modules according to embodiments of the present disclosure will be described below with reference to the drawings. It is to be noted that any of the following embodiments represents a preferred specific example. Numerical values, shapes, materials, constituent elements, arrangements and connection forms of the constituent elements, etc., which are described in the following embodiments, are merely illustrative, and they are not purported to limit the scope of the present disclosure. Moreover, among the constituent elements in the following embodiments, those ones not stated in independent Claims representing the most significant concept are explained as optional constituent elements. In the drawings, sizes and so on are not always exactly true in a strict sense.

Embodiment 1

[1-1. Circuit Configuration of Communication Device Including Switch Module]

First, a communication device 109 including a switch module 1 according to Embodiment 1 is described.

FIG. 1 is a circuit diagram of the communication device 109 including the switch module 1.

A communication device 109 includes the switch module 1, a plurality of filters 103 and 104, a plurality of amplifier circuits 105 and 106, and an RFIC 107. An antenna element 102 is connected to an antenna common terminal 101 of the communication device 109.

The switch module 1 has lead terminals 31a, 31b and 31c through which RF signals (radio frequency signals) are inputted and outputted. A wiring path connecting the lead terminals 31a and 31c and a wiring path connecting the lead terminals 31b and 31c are joined at a node nc that is located midway in each of the wiring paths.

The antenna common terminal 101 is connected to the lead terminal 31c. The filter 103 and the amplifier circuit 105 are connected to the lead terminal 31a in the mentioned order. The filter 104 and the amplifier circuit 106 are connected to the lead terminal 31b in the mentioned order. The RFIC 107 for processing radio frequency signals is connected to each of the amplifier circuits 105 and 106.

The switch module 1 includes a switch circuit 21. The switch circuit 21 is controlled to turn ON/OFF by a later-described control circuit.

The switch circuit 21 includes a plurality of switches 23 and 24 and pad terminals 11a, 11b and 11c. The pad terminal 11a is connected to the lead terminal 31a, the pad terminal 11b is connected to the lead terminal 31b, and the pad terminal 11c is connected to the lead terminal 31c.

The switch 23 has one terminal 23a and the other terminal 23b and is disposed on a wiring path connecting the pad terminal 11a and the node nc. The switch 24 has one terminal 24a and the other terminal 24b and is disposed on a wiring path connecting the pad terminal 11b and the node nc.

More specifically, a wiring on the same side as the one terminal 23a of the switch 23 and a wiring on the same side as the one terminal 24a of the switch 24 are connected to each other at the node nc. In other words, the one terminal 23a and the one terminal 24a are connected to the lead terminal 31c through the node nc and the pad terminal 11c. The other terminal 23b of the switch 23 and the other terminal 24b of the switch 24 are not connected to each other. The other terminal 23b is connected to the lead terminal 31a through the pad terminal 11a, and the other terminal 24b is connected to the lead terminal 31b through the pad terminal 11b.

The switch module 1 is a module for alternately switching an input path and an output path of the RF signal in the communication device 109. More specifically, when the switch 23 is conducted, the switch 24 is not conducted, and when the switch 24 is conducted, the switch 23 is not conducted.

The RF signal inputted to and outputted from the switch module 1 is, for example, an RF signal of 5 GHz band specified in the IEEE802.11 standards. This embodiment is described, by way of example, in connection with the case in which the RF signal inputted to the lead terminal 31c is outputted from the lead terminal 31a and the RF signal inputted to the lead terminal 31b is outputted from the lead terminal 31c. In that case, the filter 103 is a filter for reception, the amplifier circuit 105 is a low-noise amplifier, and a path connecting the antenna common terminal 101 and the amplifier circuit 105 is a reception path to receive the RF signal. Furthermore, in that case, the filter 104 is a filter for transmission, the amplifier circuit 106 is a power amplifier, and a path connecting the antenna common terminal 101 and the amplifier circuit 106 is a transmission path to transmit the RF signal.

[1-2. Circuit configuration of Switch Module]

Figure 2:
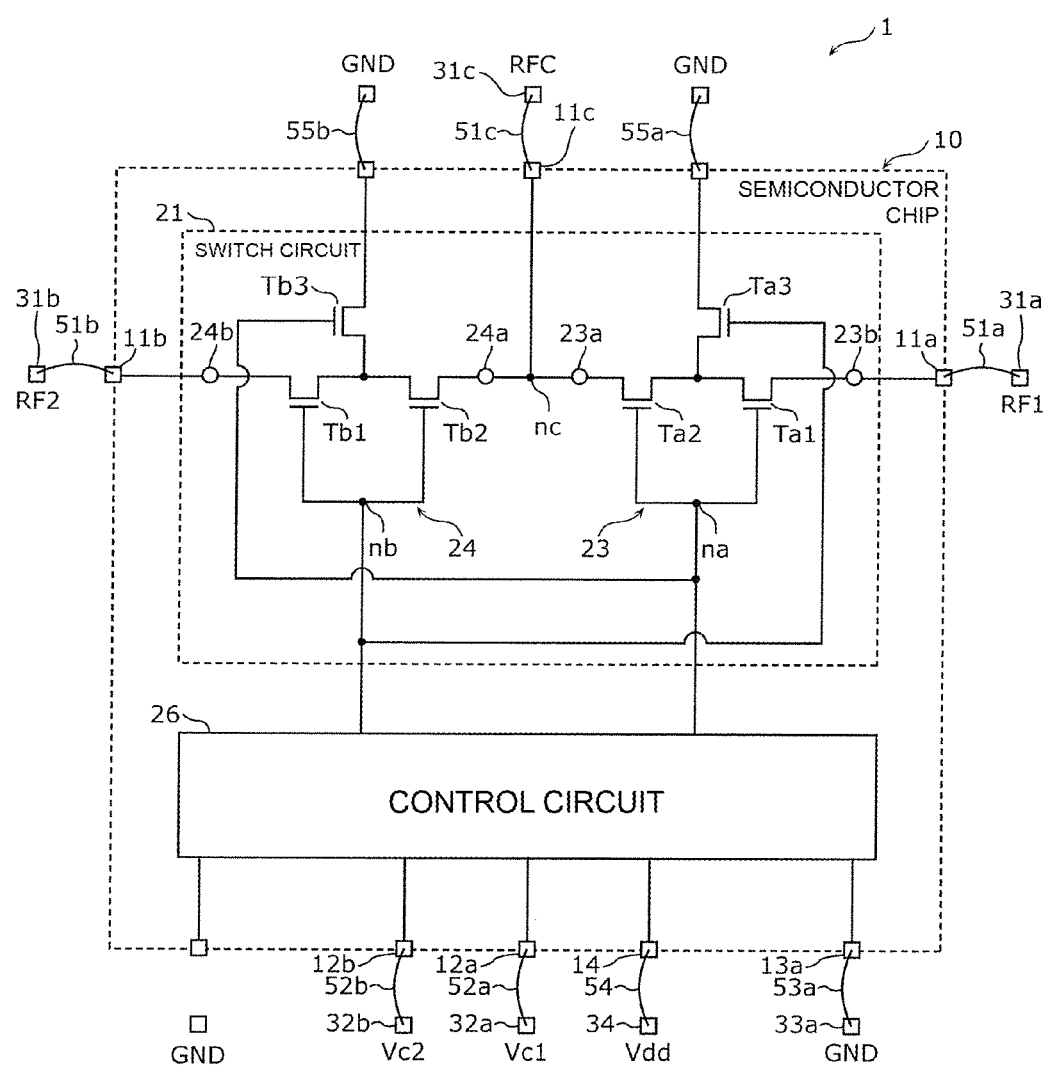
FIG. 2 is a diagrammatic view illustrating a circuit configuration of the switch module according to Embodiment 1.

The circuit configuration of the switch module 1 will be described below. FIG. 2 is a diagrammatic view illustrating the circuit configuration of the switch module 1.

The switch module 1 includes a semiconductor chip 10 and a substrate. The semiconductor chip 10 has a plurality of the pad electrodes 11a, 11b, 11c, 12a, 12b, 13a and 14. The substrate has a plurality of lead electrodes 31a, 31b, 31c, 32a, 32b, 33a and 34. Pairs of those pad electrodes and those lead electrodes are connected by respectively a plurality of bonding wires 51a, 51b, 51c, 52a, 52b, 53a and 54. Note that the pad electrodes 11a, 11b and 11c correspond to respectively the pad terminals 11a, 11b and 11c illustrated in FIG. 1, and the lead electrodes 31a, 31b and 31c correspond to respectively the lead terminals 31a, 31b and 31c illustrated in FIG. 1.

The semiconductor chip 10 includes the switch circuit 21 and a control circuit 26. The switch circuit 21 includes the plurality of switches 23 and 24. The switch circuit 21 is constituted by a plurality of transistors Ta1, Ta2, Ta3, Tb1, Tb2 and Tb3. Those transistors are, for example, field effect transistors of the MOS (metal oxide semiconductor) structure. Those transistors may be bipolar transistors.

The switch 23 includes the transistors Ta1 and Ta2 that are connected in series. For example, a drain of the transistor Ta2 is connected to one terminal 23a of the switch 23, a drain of the transistor Ta1 is connected to a source of the transistor Ta2, and the other terminal 23b of the switch 23 is connected to a source of the transistor Ta1. A wiring led out from a gate of the transistor Ta1 and a wiring led out from a gate of the transistor Ta2 are joined at the node na and then connected to the control circuit 26. The transistor Ta3 is connected between a ground (GND) and a node between the transistors Ta1 and Ta2. A wiring led out from a gate of the transistor Ta3 is connected to a wiring between a later-described node nb and the control circuit 26.

The switch 24 includes the transistors Tb1 and Tb2 that are connected in series. For example, a drain of the transistor Tb1 is connected to the other terminal 24b of the switch 24, a drain of the transistor Tb2 is connected to a source of the transistor Tb1, and one terminal 24a of the switch 24 is connected to a source of the transistor Tb2. A wiring led out from a gate of the transistor Tb1 and a wiring led out from a gate of the transistor Tb2 are joined at the node nb and then connected to the control circuit 26. The transistor Tb3 is connected between the ground (GND) and a node between the transistors Tb1 and Tb2. A wiring led out from a gate of the transistor Tb3 is connected to a wiring between the node na and the control circuit 26.

The control circuit 26 is a circuit for operating the transistors in the switch circuit 21. The control circuit 26 includes a regulator outputting a constant voltage, and a level shifter changing a voltage value outputted from the regulator to a predetermined voltage value. The control circuit 26 changes a power supply voltage input through the lead electrode 34 (Vdd) to a voltage value for biasing with the regulator and the level shifter. Furthermore, the control circuit 26 operates the transistors in accordance with control signals that are inputted through the lead electrode 32a (Vc1) or the lead electrode 32b (Vc2). More specifically, the control circuit 26 changes an ON/OFF voltage (for example, 1.8 V/0 V) input as the control signal to a predetermined voltage value for biasing, and then applies the bias voltage to the transistors. The control circuit 26 is not always required to include the regulator. For example, the control circuit 26 may include a negative-bias generation circuit (charge pump) and may operate the transistors with the negative-bias generation circuit.

Thus, in the switch module 1, the switch 23 is conducted by turning ON the transistors Ta1, Ta2 and Tb3 and turning OFF the transistors Tb1, Tb2 and Ta3 with the control circuit 26. When the switch 23 is conducted, the RF signal inputted to the pad electrode 11c (RFC) is outputted from the pad electrode 11a (RF1) through the switch 23.

Moreover, in the switch module 1, the switch 24 is conducted by turning ON the transistors Tb1, Tb2 and Ta3 and turning OFF the transistors Ta1, Ta2 and Tb3 with the control circuit 26. When the switch 24 is conducted, the RF signal input from the pad electrode 11b (RF2) is outputted from the lead electrode 11c (RFC) through the switch 24.

In the switch module 1 having the above-described circuit configuration, from the viewpoint of realizing a smaller size and a higher degree of integration of the switch module 1, it is desired to ensure the isolation between a wiring path through which the RF signal is inputted and output and a wiring path through which the control signal is inputted. The switch module 1 according to this embodiment has the following structure to improve isolation of electrodes and bonding wires through which the RF signals are inputted and outputted from an electrode and a bonding wire through which the control signal is inputted.

[1-3. Structure of Switch Module]

Figure 3A:
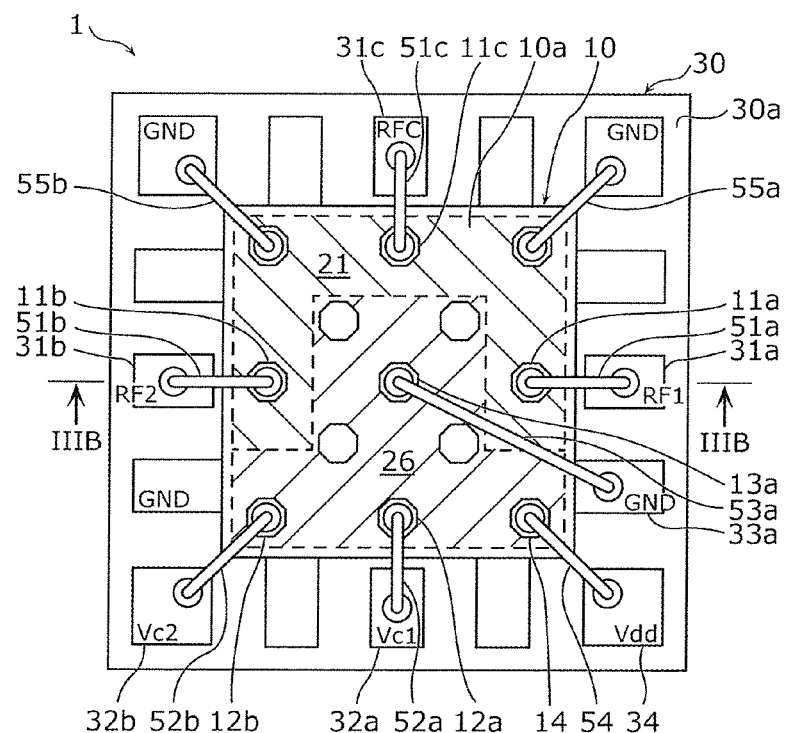
FIG. 3A is a plan view when looking at the switch module according to Embodiment 1 from the principal surface side of a substrate.
Figure 3B:
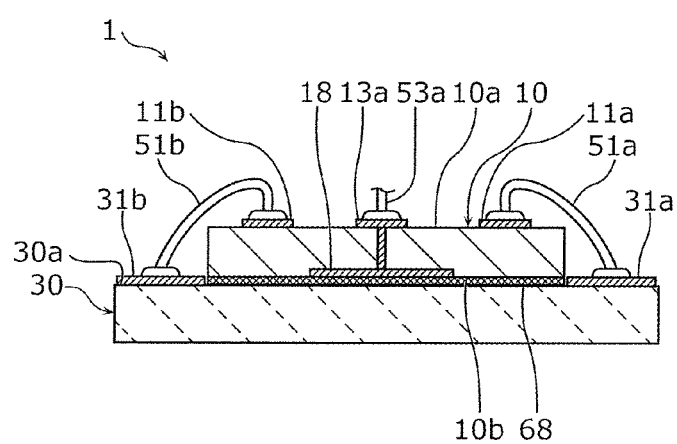
FIG. 3B is a sectional view when the switch module according to Embodiment 1 is sectioned along a line IIIB-IIIB in FIG. 3A.
Figure 3C:
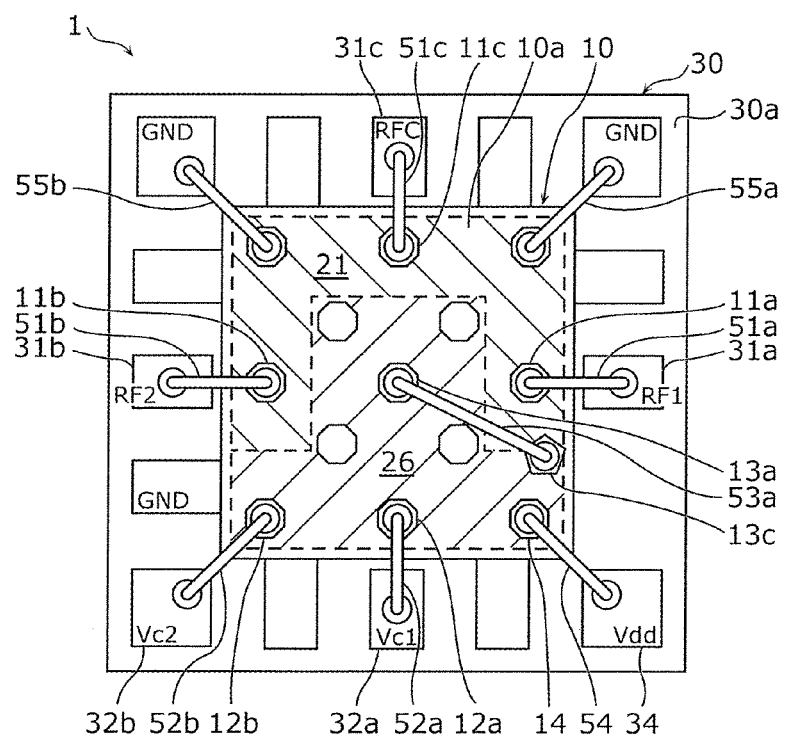
FIG. 3C is a plan view of another example of the switch module according to Embodiment 1 when looking at the switch module from the principal surface side of a substrate.

The structure of the switch module 1 will be described below with reference to FIGS. 3A, 3B and 3C. FIGS. 3A and 3C are each a plan view when looking at the switch module 1 from the side facing a principal surface 30a of a substrate 30. FIG. 3B is a sectional view when the switch module 1 is sectioned along a line IIIB-IIIB in FIG. 3A. In FIG. 3B, hatching is omitted for the bonding wires 51a, 51b and 51c.

The switch module 1 includes the semiconductor chip 10 and the substrate 30 to which the semiconductor chip 10 is mounted. The switch module 1 further includes the plurality of bonding wire connecting the plurality of pad electrodes provided on or in the semiconductor chip 10 and the plurality of lead electrodes provided on or in the substrate 30.

The semiconductor chip 10 is mounted to the substrate 30 within its outer periphery when viewed from the side facing the principal surface 30a of the substrate 30. The semiconductor chip 10 includes the switch circuit 21 and the control circuit 26. In FIG. 3A, the switch circuit 21 is disposed in a region denoted by hatching with oblique lines of minus 45°, and the control circuit 26 is disposed in a region denoted by hatching with oblique lines of plus 45°.

The semiconductor chip 10 has a rectangular parallelepiped shape and has a top surface 10a, a bottom surface 10b opposing to the top surface 10a in a back-to-back relation, and four lateral surfaces connecting the top surface 10a and the bottom surface 10b.

The RF input/output pad electrodes 11a, 11b and 11c through which the RF signals are inputted and outputted, the control-signal pad electrodes 12a and 12b through which the control signals are inputted, the power-supply pad electrode 14 connected to a power supply, and the ground pad electrode 13a connected to the ground are formed on or in the top surface 10a of the semiconductor chip 10.

The RF input/output pad electrodes 11a to 11c are each connected to the switch circuit 21. More specifically, the RF input/output pad electrode 11c is connected to the one terminal 23a of the switch 23 and the one terminal 24a of the switch 24. The RF input/output pad electrode 11a is connected to the other terminal 23b of the switch 23. The RF input/output pad electrode 11b is connected to the other terminal 24b of the switch 24 (see FIG. 2).

The control-signal pad electrodes 12a and 12b and the power-supply pad electrode 14 are connected to the control circuit 26. The ground pad electrode 13a is also connected to the control circuit 26.

The semiconductor chip 10 has a rectangular shape when looking at the semiconductor chip 10 from the side facing the top surface 10a. The control-signal pad electrodes 12a and 12b and the power-supply pad electrode 14 are arranged along one of four sides of the semiconductor chip 10 when viewed from the side facing the top surface 10a. The RF input/output pad electrodes 11a, 11b and 11c are arranged along other sides different from the above-mentioned one side of the semiconductor chip 10 when viewed from the side facing the top surface 10a.

With the above-described arrangement, in the semiconductor chip 10, distances from the RF input/output pad electrodes 11a, 11b and 11c to the control-signal pad electrodes 12a and 12b and the power-supply pad electrode 14 can be increased. Accordingly, higher isolation of the RF input/output pad electrodes 11a, 11b and 11c from the control-signal pad electrodes 12a and 12b and the power-supply pad electrode 14 can be ensured.

Furthermore, the RF input/output pad electrodes 11a, 11b and 11c are arranged on other three sides than the above-mentioned one side of the semiconductor chip 10 when viewed from the side facing the top surface 10a, and each of the RF input/output pad electrodes 11a, 11b and 11c is arranged on different one of the three sides.

With the above-described arrangement, the isolation of the RF input/output pad electrodes 11a, 11b and 11c from the control-signal pad electrodes 12a and 12b and the power-supply pad electrode 14 can be ensured.

Moreover, when looking at the semiconductor chip 10 from the side facing the top surface 10a, the RF input/output pad electrodes 11a, 11b and 11c, the control-signal pad electrodes 12a and 12b, and the power-supply pad electrode 14 are arranged along an outer periphery of the semiconductor chip 10. The ground pad electrode 13a is arranged on the inner side than the RF input/output pad electrodes 11a, 11b and 11c, the control-signal pad electrodes 12a and 12b, and the power-supply pad electrode 14.

With the above-described arrangement, in the semiconductor chip 10, the isolation of the RF input/output pad electrodes 11a, 11b and 11c from the control-signal pad electrodes 12a and 12b and the power-supply pad electrode 14 can be ensured with the presence of the ground pad electrode 13a.

A bottom surface electrode 18 is provided on or in the bottom surface 10b of the semiconductor chip 10 (see FIG. 3B). The ground pad electrode 13a provided on or in the top surface 10a of the semiconductor chip 10 is connected to the bottom surface electrode 18 through an inner conductor that is formed inside the semiconductor chip 10. The semiconductor chip 10 is mounted to the substrate 30 with a conductive bonding material 68, for example. The bottom surface electrode 18 is connected to the ground lead electrode 33a, described later, through the conductive bonding material 68 and wirings formed on or in the substrate 30.

With the above-described structure, a space occupied by the switch module 1 can be reduced in comparison with that occupied in the case of having, for example, a structure in which the bottom surface electrode 18 and the ground lead electrode 33a are not connected to each other on the substrate 30 and are separately connected to the ground outside the switch module 1.

In this embodiment, the bottom surface electrode 18 and the ground lead electrode 33a are not always required to be connected to each other on the substrate 30. For example, like the above-mentioned structure, the bottom surface electrode 18 and the ground lead electrode 33a may be each connected to the ground outside the switch module 1 (for example, on a mother board).

Furthermore, the bottom surface electrode 18 and the ground pad electrode 13a are not always required to be connected to each other through the inner conductor that is formed inside the semiconductor chip 10. For example, the bottom surface electrode 18 and the ground pad electrode 13a may be connected to each other through a lead frame that is formed between the semiconductor chip 10 and the bottom surface electrode 18.

In addition, the substrate 30 may be formed such that an outside connection electrode electrically connected to the semiconductor chip 10 may be disposed to penetrate through the substrate 30.

The substrate 30 is formed by, for example, a substrate base made of an insulating material, and a conductor portion made of a conductive material. The substrate 30 is in the form of a flat plate, and it has the principal surface 30a to which the semiconductor chip 10 is mounted, and a bottom surface opposing to the principal surface 30a in a back-to-back relation. A plurality of solder balls for mounting of the switch module 1 to a mother board may be disposed on the bottom surface of the substrate 30.

The RF input/output lead electrodes 31a, 31b and 31c through which the RF signals are inputted and outputted, the control-signal lead electrodes 32a and 32b through which the control signals are inputted, the power-supply lead electrode 34 connected to the power supply, and the ground lead electrode 33a connected to the ground are formed on or in the principal surface 30a of the substrate 30.

The substrate 30 has a rectangular shape when looking at the substrate 30 from the side facing the principal surface 30a. The control-signal lead electrodes 32a and 32b, the power-supply lead electrode 34, and the ground lead electrodes 33a are formed along an outer periphery of the substrate 30 so as to surround the semiconductor chip 10 that is mounted to position on the inner side of the substrate 30.

The control-signal lead electrodes 32a and 32b and the power-supply lead electrode 34 are arranged along one of four sides of the substrate 30 when viewed from the side facing the principal surface 30a. When viewed from the side including the switch circuit 21, the control-signal lead electrodes 32a and 32b and the power-supply lead electrode 34 are arranged at the same azimuth angle as the control-signal pad electrodes 12a and 12b and the power-supply pad electrode 14. The RF input/output lead electrodes 31a, 31b and 31c are arranged along other sides different from the above-mentioned one side of the substrate 30 when viewed from the side facing the principal surface 30a. The ground lead electrode 33a is disposed along another side different from the above-mentioned one side of the substrate 30 when viewed from the side facing the principal surface 30a, and is arranged between the RF input/output lead electrode 31a and the power-supply lead electrode 34.

The bonding wires 51a, 51b, 51c, 52a, 52b, 53a, 54, 55a and 55b are linear members formed by a wire bonding machine and contain, for example, an Au, Cu or Al material.

Among the above-mentioned bonding wires, the bonding wires through which the RF signals are inputted and outputted are called the RF input/output wires 51a, 51b and 51c, the bonding wires through which the control signals are inputted is called the control signal wires 52a and 52b, the bonding wire connected to the predetermined ground is called the ground wire 53a, and the bonding wire connected to the power supply is called the power-supply wire 54. In addition, the bonding wires different from the above-mentioned ones are called the connection wire 55a and 55b.

The RF input/output wire 51a connects the RF input/output pad electrode 11a and the RF input/output lead electrode 31a. The RF input/output wire 51b connects the RF input/output pad electrode 11b and the RF input/output lead electrode 31b. The RF input/output wire 51c connects the RF input/output pad electrode 11c and the RF input/output lead electrode 31c.

The control signal wire 52a connects the control-signal pad electrode 12a and the control-signal lead electrode 32a. The control signal wire 52b connects the control-signal pad electrode 12b and the control-signal lead electrode 32b.

The ground wire 53a is a shield wire connected to the ground and connects the ground pad electrode 13a and the ground lead electrode 33a.

The ground wire 53a may not need to be connected to the ground lead electrode 33a. FIG. 3C is a plan view of another example of the switch module 1 when looking at the switch module from the side facing the principal surface 30a of the substrate 30. As illustrated in FIG. 3C, for example, one end of the ground wire 53a may be connected to the ground pad electrode 13a, and the other end thereof may be connected to another pad electrode 13c that is formed on or in the top surface 10a of the semiconductor chip 10. In that case, for example, other one or more pad electrodes arranged around the pad electrode 13a (for example, at least one among four pad electrodes arranged to surround the pad electrode 13a in FIG. 3C) are connected to the ground.

The power-supply wire 54 connects the power-supply pad electrode 14 and the power-supply lead electrode 34.

Each of the connection wires 55a and 55b connects the predetermined pad electrode provided in the switch circuit 21 and the predetermined lead electrodes provided on or in the substrate 30 in a one-to-one relation. The connection wires 55a and 55b are wires for connecting respectively the transistors Ta3 and Tb3 to the ground.

Although omitted in FIG. 3B, an encapsulation resin is formed on the principal surface 30a of the substrate 30 to cover the semiconductor chip 10, the pad electrodes, the lead electrodes, and the bonding wires.

Figure 4:
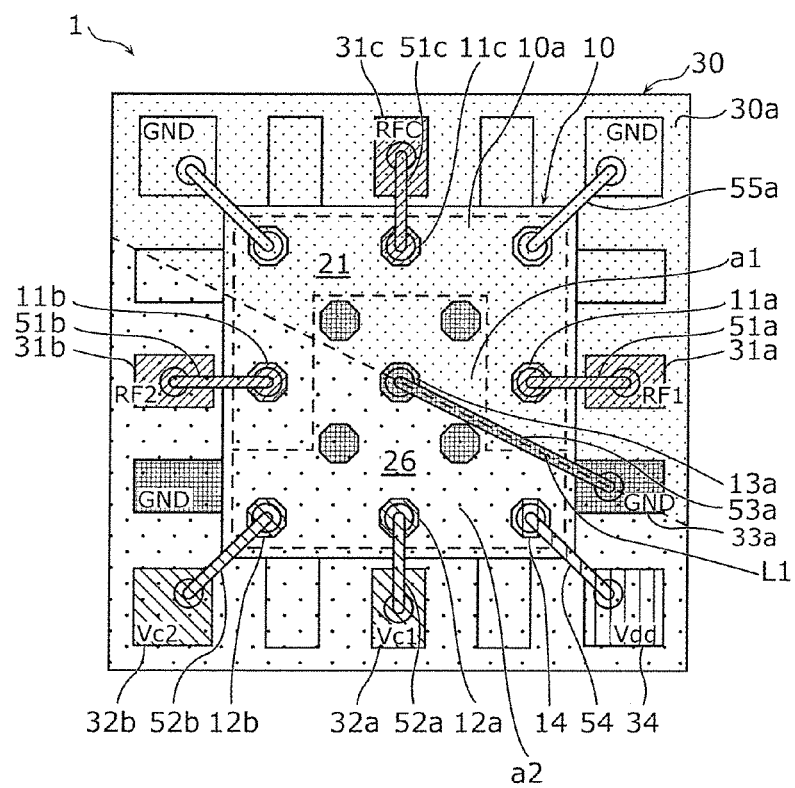
FIG. 4 is a plan view illustrating a positional relation in layout among pad electrodes, lead electrodes, and bonding wires in the switch module according to Embodiment 1.

A positional relation in layout among the pad electrodes, the lead electrodes, and the bonding wires in the switch module 1 will be described in detail below. FIG. 4 is a plan view illustrating the positional relation in layout among the pad electrodes, the lead electrodes, and the bonding wires in the switch module 1.

As illustrated in FIG. 4, when looking at the switch module 1 in plan from the side facing the principal surface 30a of the substrate 30 and assuming a linear line along an extension direction of the ground wire 53a to be a linear line L1, a region on the substrate 30 is partitioned by the linear line L1 defining a boundary into a region a1 (region denoted by dense dots) and a region a2 (region denoted by sparse dots).

Here, when paying attention to, among the electrodes and the bonding wires through which the RF signals are inputted and outputted, the pad electrodes, the lead electrodes, and the bonding wires all positioned on the reception path side, the RF input/output wire 51a, the RF input/output pad electrode 11a, and the RF input/output lead electrode 31a are disposed in the region a1. Furthermore, when paying attention to, among the electrodes and the bonding wires connected to the control circuit 26, the pad electrodes, the lead electrodes, and the bonding wires through all of which the control signals are inputted, the control-signal pad electrodes 12a and 12b, the control-signal lead electrodes 32a and 32b, and the control signal wires 52a and 52b are disposed in the region a2.

As described above, in this embodiment, the control-signal pad electrodes 12a and 12b, the control-signal lead electrodes 32a and 32b, and the control signal wires 52a and 52b are disposed in the region a2 on the opposite side, with respect to the boundary defined by the linear line L1 along the extension direction of the ground wire 53a, to the region a1 in which the RF input/output wire 51a, the RF input/output pad electrode 11a, and the RF input/output lead electrode 31a are disposed.

As a result, reduction of isolation of the RF input/output pad electrode 11a, the RF input/output lead electrode 31a, and the RF input/output wire 51a from the control-signal pad electrodes 12a and 12b, the control-signal lead electrodes 32a and 32b, and the control signal wires 52a and 52b can be suppressed. Hence, isolation between the switch circuit 21 and the control circuit 26 can be enhanced.

Furthermore, in this embodiment, when looking at the switch module 1 from the side facing the principal surface 30a of the substrate 30, at least one of the ground pad electrode 13a, the ground lead electrode 33a, and the ground wire 53a is disposed between the RF input/output pad electrode 11a and the control-signal pad electrodes 12a and 12b, between the RF input/output lead electrode 31a and the control-signal lead electrodes 32a and 32b, and between the RF input/output wire 51a and the control signal wires 52a and 52b.

As a result, reduction of the isolation between the RF input/output pad electrode 11a and the control-signal pad electrodes 12a and 12b, between the RF input/output lead electrode 31a and the control-signal lead electrodes 32a and 32b, and between the RF input/output wire 51a and the control signal wires 52a and 52b can be further suppressed.

Moreover, in this embodiment, as illustrated in FIG. 3A, when looking at the switch module 1 from the side facing the principal surface 30a of the substrate 30, at least one of the ground pad electrode 13a, the ground lead electrode 33a, and the ground wire 53a is disposed between the RF input/output pad electrode 11a and the power-supply pad electrode 14, between the RF input/output lead electrode 31a and the power-supply lead electrode 34, and between the RF input/output wire 51a and the power-supply wire 54.

As a result, reduction of the isolation between the RF input/output pad electrode 11a and the power-supply pad electrode 14, between the RF input/output lead electrode 31a and the power-supply lead electrode 34, and between the RF input/output wire 51a and the power-supply wire 54 can be suppressed.

[1-4. Advantageous Effects and Others]

An evaluation result of the isolation in the switch module 1 having the above-described structure will be described below. The isolation was evaluated in accordance with a value of a second-order harmonic distortion generated in the switch module 1 or a difference (hereinafter called a "range") between a maximum value and a minimum value of the harmonic distortion. In this evaluation, when the isolation between the switch circuit 21 and the control circuit 26 in the switch module 1 is low, the switch circuit 21 and the control circuit 26 affect each other and the value or the range of the harmonic distortion generated in the switch module 1 increases. On the other hand, as the value or the range of the harmonic distortion decreases, noise imposed on a signal in a wiring path formed inside the switch module 1 reduces and the isolation between the switch circuit 21 and the control circuit 26, namely, the isolation in the switch module 1, is enhanced.

Figure 5:
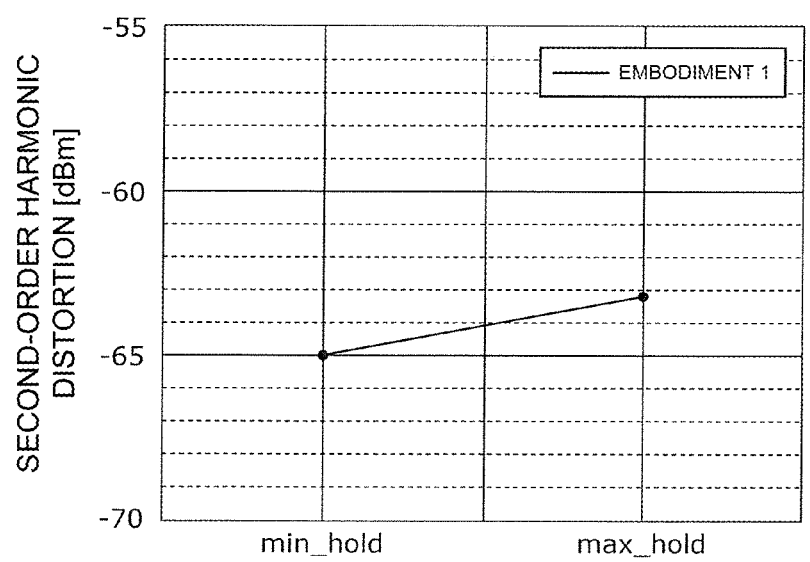
FIG. 5 depicts a second-order harmonic distortion generated in the switch module according to Embodiment 1.

FIG. 5 depicts a second-order harmonic distortion generated in the switch module 1.

In the measurement of the second-order harmonic distortion, the radio frequency signal inputted to and outputted from the RF input/output lead electrodes 31a, 31b and 31c was a signal of 5.925 GHz. The power supply voltage inputted to the power-supply lead electrode 34 was set to 3.6 V. A control voltage inputted to the control-signal lead electrodes 32a and 32b was set to 1.8 V/0 V, and the switches 23 and 24 in the switch circuit 21 were alternately turned ON/OFF. The second-order harmonic distortion generated between the RF input/output lead electrode 31c and the RF input/output lead electrode 31a was measured by using a spectrum analyzer. At that time, noise, namely one of factors generating harmonics, was intentionally generated by, for example, changing mounting conditions, and the maximum value and the minimum value of the measured second-order harmonic distortion were depicted in a graphic form.

As seen from FIG. 5, in the switch module 1, the range of the second-order harmonic distortion is 1.8 dBm. For example, when the mounting conditions are changed to intentionally generate noise in, for example, a switch module that does not include the ground wire 53a serving as the shield wire, the range of the second-order harmonic distortion is 2.6 dBm or more. The range of the harmonic distortion in the switch module 1 according to this embodiment is reduced in comparison with that in the above case.

As described above, the switch module 1 according to this embodiment includes the semiconductor chip 10 including the switch circuit 21 and the control circuit 26 controlling the switch circuit 21, and the substrate 30 to which the semiconductor chip 10 is mounted. Two or more RF input/output lead electrodes (for example, 31a and 31c) through which the RF signals are inputted and outputted and the control-signal lead electrodes 32a and 32b through which the control signals are inputted are provided on or in the principal surface 30a of the substrate 30. Two or more RF input/output pad electrodes (for example, 11a and 11c) through which the RF signals are inputted and outputted, the control-signal pad electrodes 12a and 12b through which the control signals are inputted, and the ground pad electrode 13a connected to the ground are provided on or in the top surface 10a of the semiconductor chip 10. The RF input/output pad electrodes 11a and 11c are connected to the switch circuit 21, and the control-signal pad electrodes 12a and 12b and the ground pad electrode 13a are connected to the control circuit 26. The switch module 1 further includes two or more RF input/output wires (for example, 51a and 51b) that are bonding wires connecting the two or more RF input/output pad electrodes 11a and 11c and the two or more RF input/output lead electrodes 31a and 31c in a one-to-one relation, the control signal wires 52a and 52b that are bonding wires connecting respectively the control-signal pad electrodes 12a and 12b and the control-signal lead electrodes 32a and 32b, and the ground wire 53a that is a bonding wire connected to the ground pad electrode 13a.

When looking at the switch module 1 from the side facing the principal surface 30a of the substrate 30, the control-signal pad electrodes 12a and 12b, the control-signal lead electrodes 32a and 32b, and the control signal wires 52a and 52b are disposed in the region a2 on the opposite side, with respect to the boundary defined by the linear line L1 along the extension direction of the ground wire 53a, to the region a1 in which at least one 51a of the two or more RF input/output wires 51a and 51c, the RF input/output pad electrode 11a connected to the at least one RF input/output wire 51a, and the RF input/output lead electrode 31a connected to the at least one RF input/output wire 51a are disposed.

With the switch module 1 having the above-described structure, reduction of the isolation of the RF input/output pad electrode 11a, the RF input/output lead electrode 31a, and the RF input/output wire 51a from the control-signal pad electrodes 12a and 12b, the control-signal lead electrodes 32a and 32b, and the control signal wires 52a and 52b can be suppressed. It is, therefore, possible to reduce mutual influences between the switch circuit 21 and the control circuit 26, to reduce the value or the range of the harmonic distortion in the switch module 1, and to enhance the isolation in the switch module 1.

Embodiment 2

A switch module 1A according to Embodiment 2 will be described below. The switch module 1A according to Embodiment 2 is different from the switch module according to Embodiment 1 in including two ground wires 53a and 53b.

Figure 6:
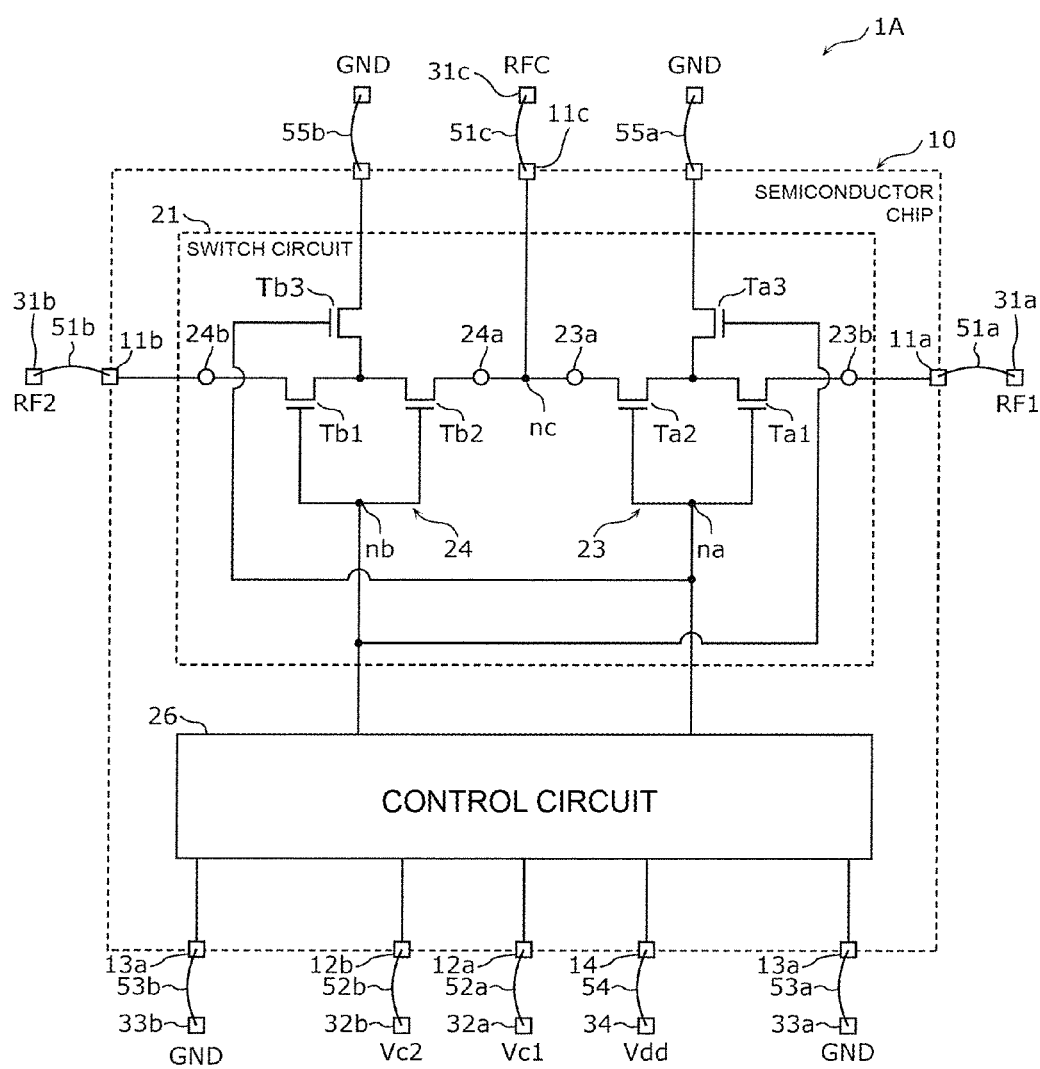
FIG. 6 is a diagrammatic view illustrating a circuit configuration of a switch module according to Embodiment 2.
Figure 7:
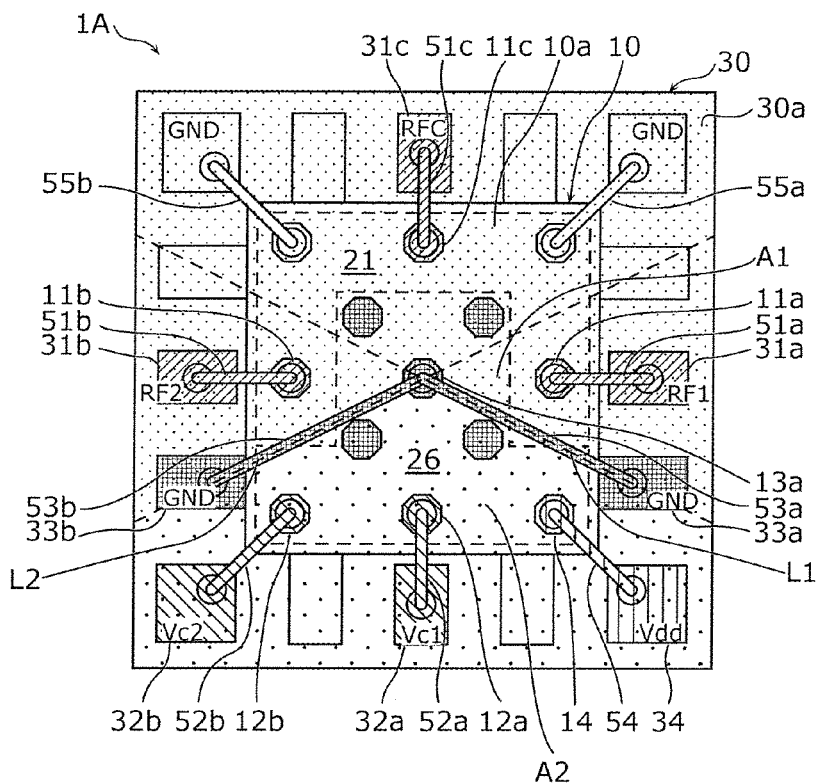
FIG. 7 is a plan view illustrating a positional relation in layout among pad electrodes, lead electrodes, and bonding wires in the switch module according to Embodiment 2.

FIG. 6 is a diagrammatic view illustrating a circuit configuration of the switch module 1A. FIG. 7 is a plan view illustrating a positional relation in layout among pad electrodes, lead electrodes, and bonding wires in the switch module 1A. Note that two ground pad electrodes 13a illustrated in FIG. 6 are the same pad electrode.

The switch module 1A includes the semiconductor chip 10 and the substrate 30 to which the semiconductor chip 10 is mounted. The switch module 1A further includes a plurality of bonding wires connecting a plurality of pad electrodes provided on or in the semiconductor chip 10 and a plurality of lead electrodes provided on or in the substrate 30.

The RF input/output pad electrodes 11a, 11b and 11c through which the RF signals are inputted and outputted, the control-signal pad electrodes 12a and 12b through which the control signals are inputted, the power-supply pad electrode 14 connected to the power supply, and the ground pad electrode 13a connected to the ground are formed on or in the top surface 10a of the semiconductor chip 10.

The RF input/output lead electrodes 31a, 31b and 31c through which the RF signals are inputted and outputted, the control-signal lead electrodes 32a and 32b through which the control signals are inputted, the power-supply lead electrode 34 connected to the power supply, and two ground lead electrodes 33a and 33b connected to the ground are formed on or in the principal surface 30a of the substrate 30.

The substrate 30 has a rectangular shape when looking at the substrate 30 from the side facing the principal surface 30a. The control-signal lead electrodes 32a and 32b, the power-supply lead electrode 34, and the ground lead electrode 33a and 33b are formed along the outer periphery of the substrate 30 so as to surround the semiconductor chip 10 that is mounted to position on the inner side of the substrate 30.

The control-signal lead electrodes 32a and 32b and the power-supply lead electrode 34 are arranged along one of four sides of the substrate 30 when viewed from the side facing the principal surface 30a. The RF input/output lead electrodes 31a, 31b and 31c are arranged along other sides different from the above-mentioned one side of the substrate 30.

The ground lead electrode 33a is disposed along another side different from the above-mentioned one side of the substrate 30 when viewed from the side facing the principal surface 30a, and is arranged between the RF input/output lead electrode 31a and the power-supply lead electrode 34. The ground lead electrode 33b is disposed along still another side different from the above-mentioned one side of the substrate 30 when viewed from the side facing the principal surface 30a, and is arranged between the RF input/output lead electrode 31b and the control-signal lead electrode 32b.

The bonding wires 51a, 51b, 51c, 52a, 52b, 53a, 53b, 54, 55a and 55b are linear members formed by a wire bonding machine. Among those bonding wires, the bonding wires connected to the predetermined ground are called the ground wires 53a and 53b.

The ground wire 53a is a shield wire connected to the ground, and it connects the ground pad electrode 13a and the ground lead electrode 33a. The ground wire 53b is a shield wire connected to the ground, and it connects the ground pad electrode 13a and the ground lead electrode 33b. The ground wires 53a and 53b are connected to the same ground pad electrode 13a.

A positional relation in layout among the pad electrodes, the lead electrodes, and the bonding wires in the switch module 1A will be described in detail below.

As illustrated in FIG. 7, when looking at the switch module 1A in plan from the side facing the principal surface 30a of the substrate 30, assuming a linear line along an extension direction of the ground wire 53a to be a linear line L1, and assuming a linear line along an extension direction of the ground wire 53b to be a linear line L2, a region on the substrate 30 is partitioned by the linear line L1 and the linear line L2, each of which defines a boundary, into a first region A1 (region denoted by dense dots) and a second region A2 (region denoted by sparse dots).

Here, the RF input/output wires 51a, 51b and 51c, the RF input/output pad electrode 11a, 11b and 11c, and the RF input/output lead electrodes 31a, 31b and 31c are disposed in the first region A1. The control-signal pad electrodes 12a and 12b, the control-signal lead electrodes 32a and 32b, and the control signal wires 52a and 52b are disposed in the second region A2. In addition, the power-supply pad electrode 14, the power-supply lead electrode 34, and the power-supply wire 54 are disposed in the second region A2.

Thus, in this embodiment, the control-signal pad electrodes 12a and 12b, the control-signal lead electrodes 32a and 32b, and the control signal wires 52a and 52b are disposed in the second region A2 that is one of regions on the substrate 30 partitioned by the two linear lines L1 and L2 along the extension directions of the ground wires 53a and 53b, the second region A2 being positioned on the opposite side to the first region A1 in which the RF input/output wires 51a to 51c, the RF input/output pad electrodes 11a to 11c, and the RF input/output lead electrodes 31a to 31c are disposed.

As a result, reduction of the isolation of the RF input/output pad electrodes 11a to 11c, the RF input/output lead electrodes 31a to 31c, and the RF input/output wires 51a to 51c from the control-signal pad electrodes 12a and 12b, the control-signal lead electrodes 32a and 32b, and the control signal wires 52a and 52b can be suppressed.

Furthermore, the power-supply pad electrode 14, the power-supply lead electrode 34, and the power-supply wire 54 are disposed in the second region A2.

As a result, reduction of the isolation of the RF input/output pad electrodes 11a to 11c, the RF input/output lead electrodes 31a to 31c, and the RF input/output wires 51a to 51c from the power-supply pad electrode 14, the power-supply lead electrode 34, and the power-supply wire 54 can be suppressed. Moreover, harmonics generated from a power supply line can be suppressed from imposing on the RF signals transferred through the RF input/output pad electrodes 11a to 11c, the RF input/output lead electrodes 31a to 31c, and the RF input/output wires 51a to 51c.

An evaluation result of the isolation in the switch module 1A having the above-described structure will be described below. A method of measuring a harmonic distortion in relation to the isolation is the same as that described in Embodiment 1.

Figure 8:
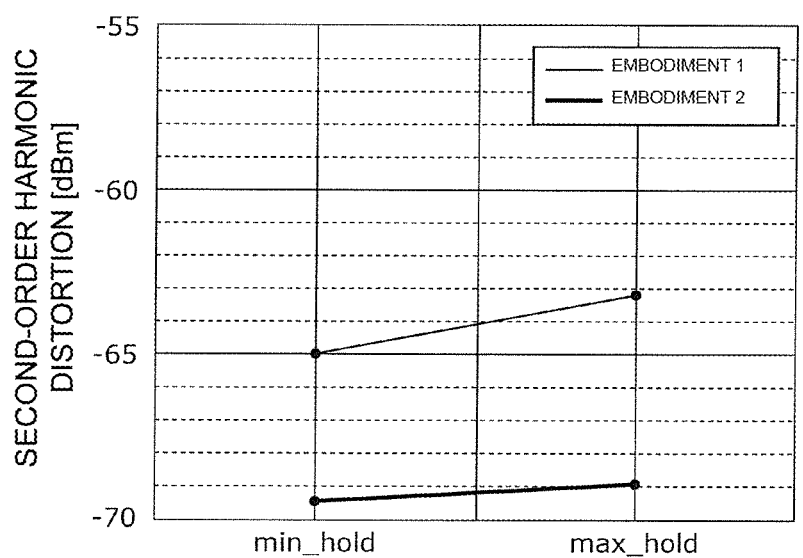
FIG. 8 depicts a second-order harmonic distortion generated in the switch module according to Embodiment 2.

FIG. 8 depicts a second-order harmonic distortion generated in the switch module 1A.

As seen from FIG. 8, in the switch module 1A according to Embodiment 2, the minimum value of the second-order harmonic distortion is −69.4 dBm, the maximum value is −68.8 dBm, and the range is 0.6 dBm. In the switch module 1 according to Embodiment 1, the minimum value of the second-order harmonic distortion is −64.9 dBm, the maximum value is −63.1 dBm, and the range is 1.8 dBm. Thus, in the switch module 1A according to Embodiment 2, the value of second-order harmonic distortion is reduced, and the range of the second-order harmonic distortion is also reduced in comparison with those in the switch module 1 according to Embodiment 1.

Stated in another way, since the region in which the electrodes and the wires on the same side as the switch circuit 21 are disposed and the region in which the electrodes and the wires on the same side as the control circuit 26 are disposed are separated by two shield wires, this embodiment provides the advantageous effect of reducing the mutual influences between the switch circuit 21 and the control circuit 26 in comparison with those in Embodiment 1. The above-mentioned effect tends to increase when, as in this embodiment, all terminals (electrodes and wires) on the same side as the switch circuit 21 are disposed in the region different from the region in which all terminals (electrodes and wires) on the same side as the control circuit 26 are disposed, with the plurality of linear lines L1 and L2 along the extension directions of the shield wires being boundaries.

As described above, the switch module 1A according to this embodiment includes the semiconductor chip 1 including the switch circuit 21 and the control circuit 26 controlling the switch circuit 21, and the substrate 30 to which the semiconductor chip 10 is mounted. Two or more RF input/output lead electrodes (for example, 31a, 31b and 31c) through which the RF signals are inputted and outputted and one or more control-signal lead electrodes (for example, 32a and 32b) through which the control signals are inputted are provided on or in the principal surface 30a of the substrate 30. Two or more RF input/output pad electrodes (for example, 11a, 11b and 11c) through which the RF signals are inputted and outputted, one or more control-signal pad electrodes (for example, 12a and 12b) through which the control signals are inputted, and one or more ground pad electrodes (for example, 13a) connected to the ground are provided on or in the top surface 10a of the semiconductor chip 10. The RF input/output pad electrodes 11a to 11c are connected to the switch circuit 21, and the control-signal pad electrodes 12a and 12b and the ground pad electrode 13a are connected to the control circuit 26. The switch module 1A further includes two or more RF input/output wires (for example, 51a, 51b and 51c) that are bonding wires connecting the two or more RF input/output pad electrodes 11a to 11c and the two or more RF input/output lead electrodes 31a to 31c in a one-to-one relation, one or more control signal wires (for example, 52a and 52b) that are bonding wires connecting the one or more control-signal pad electrodes 12a and 12b and the one or more control-signal lead electrodes 32a and 32b in a one-to-one relation, and two or more ground wires (for example, 53a and 53b) that are bonding wires connected to the ground pad electrode 13a.

When looking at the switch module 1A from the side facing the principal surface 30a of the substrate 30, the control-signal pad electrodes 12a and 12b, the control-signal lead electrodes 32a and 32b, and the control signal wires 52a and 52b are disposed in the region A2 that is one of the regions on the switch module 1A partitioned by the two or more linear lines L1 and L2 along the extension directions of the two or more ground wires 53a and 53b when viewed from the side facing the principal surface 30a, the second region A2 being different from the first region A1 in which the RF input/output pad electrodes 11a to 11c, and the RF input/output lead electrodes 31a to 31c, and the RF input/output wires 51a to 51c are disposed.

With the switch module 1A having the above-described structure, reduction of the isolation of the RF input/output pad electrodes 11a to 11c, the RF input/output lead electrodes 31a to 31c, and the RF input/output wires 51a to 51c from the control-signal pad electrodes 12a and 12b, the control-signal lead electrodes 32a and 32b, and the control signal wires 52a and 52b can be suppressed. It is, therefore, possible to enhance the isolation between the switch circuit 21 and the control circuit 26.

Furthermore, in this embodiment, when looking at the switch module 1A from the side facing the principal surface 30a of the substrate 30, at least one of the ground pad electrode 13a, the ground lead electrodes 33a and 33b, and the ground wires 53a and 53b is disposed between the RF input/output pad electrodes 11a to 11c and the control-signal pad electrodes 12a and 12b, between the RF input/output lead electrodes 31a to 31c and the control-signal lead electrodes 32a and 32b, and between the RF input/output wires 51a to 51c and the control signal wires 52a and 52b.

As a result, reduction of the isolation between the RF input/output pad electrodes 11a to 11c and the control-signal pad electrodes 12a and 12b, between the RF input/output lead electrodes 31a to 31c and the control-signal lead electrodes 32a and 32b, and between the RF input/output wires 51a to 51c and the control signal wires 52a and 52b can be further suppressed.

Moreover, in this embodiment, when looking at the switch module 1A from the side facing the principal surface 30a of the substrate 30, at least one of the ground pad electrode 13a, the ground lead electrodes 33a and 33b, and the ground wires 53a and 53b is disposed between the RF input/output pad electrodes 11a to 11c and the power-supply pad electrode 14, between the RF input/output lead electrodes 31a to 31c and the power-supply lead electrode 34, and between the RF input/output wires 51a to 51c and the power-supply wire 54.

As a result, reduction of the isolation between the RF input/output pad electrodes 11a to 11c and the power-supply pad electrode 14, between the RF input/output lead electrodes 31a to 31c and the power-supply lead electrode 34, and between the RF input/output wires 51a to 51c and the power-supply wire 54 can be suppressed.

Modification of Embodiment 2

A switch module 1B according to a modification of Embodiment 2 will be described below. The switch module 1B according to the modification of Embodiment 2 is different from the switch module according to Embodiment 2 in that two ground wires 53a and 53b are connected to respectively two ground pad electrodes 13a and 13b.

Figure 9:
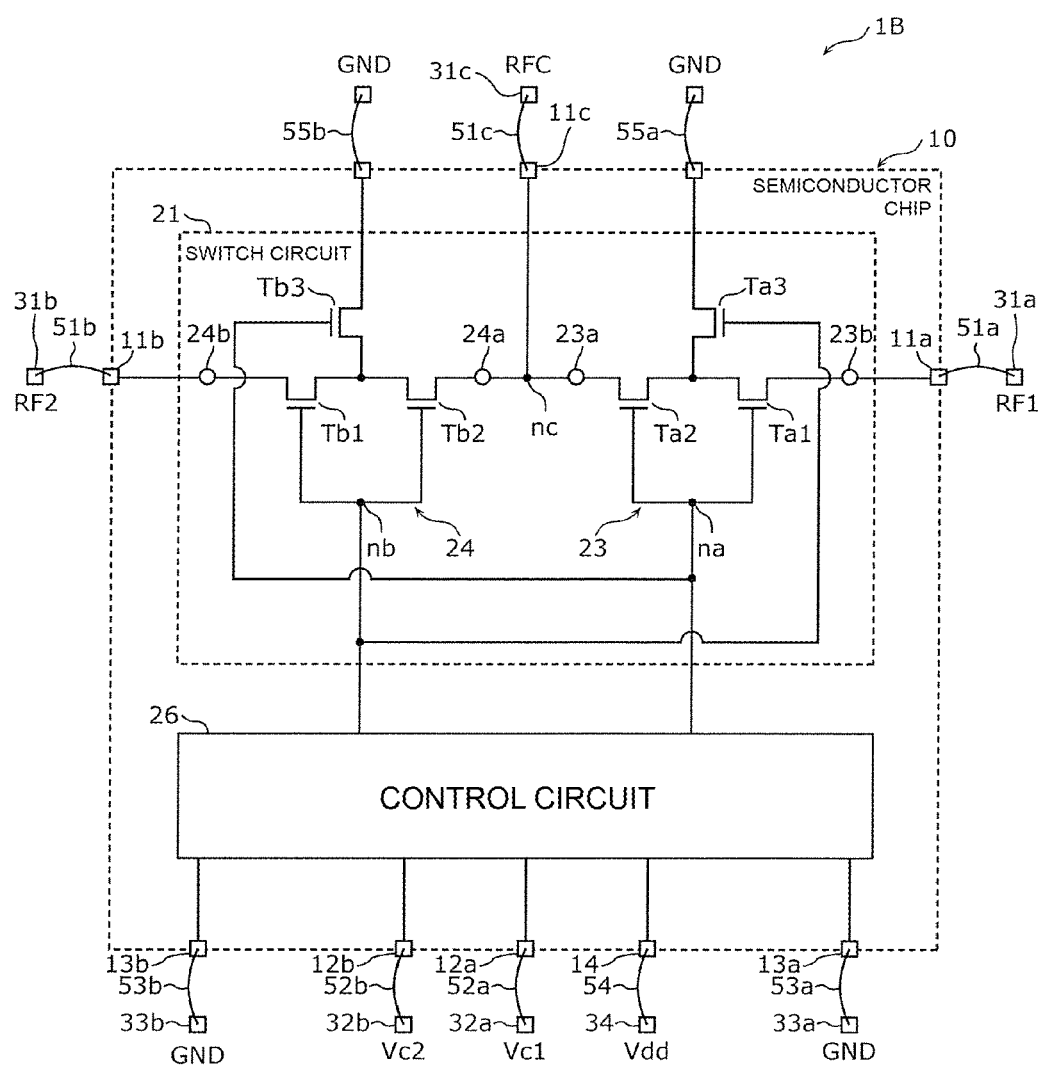
FIG. 9 is a diagrammatic view illustrating a circuit configuration of a switch module according to a modification of Embodiment 2.
Figure 10A:
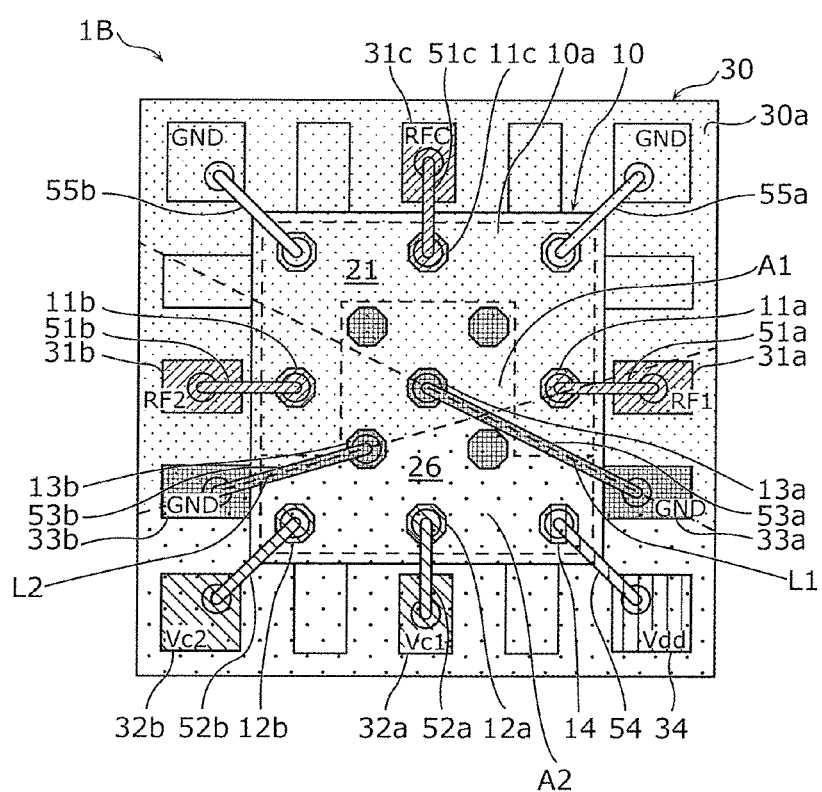
FIG. 10A is a plan view illustrating a positional relation in layout among pad electrodes, lead electrodes, and bonding wires in the switch module according to the modification of Embodiment 2.
Figure 10B:
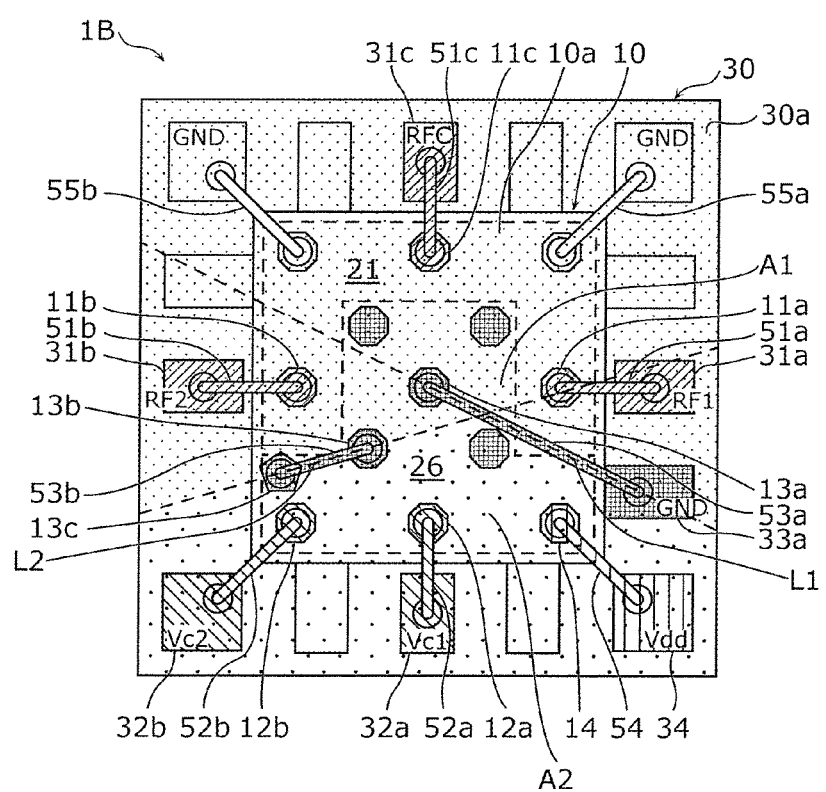
FIG. 10B is a plan view illustrating a positional relation in layout among pad electrodes, lead electrodes, and bonding wires in another example of the switch module according to the modification of Embodiment 2.

FIG. 9 is a diagrammatic view illustrating a circuit configuration of the switch module 1B. FIGS. 10A and 10B are each a plan view illustrating a positional relation in layout among pad electrodes, lead electrodes, and bonding wires in the switch module 1B.

The RF input/output pad electrodes 11a, 11b and 11c through which the RF signals are inputted and outputted, the control-signal pad electrodes 12a and 12b through which the control signals are inputted, the power-supply pad electrode 14 connected to the power supply, and the ground pad electrodes 13a and 13b connected to the ground are formed on or in the top surface 10a of the semiconductor chip 10. The ground pad electrodes 13a and 13b are connected to the control circuit 26.

When looking at the semiconductor chip 10 from the side facing the top surface 10a, the RF input/output pad electrodes 11a, 11b and 11c, the control-signal pad electrodes 12a and 12b, and the power-supply pad electrode 14 are arranged along the outer periphery of the semiconductor chip 10. The ground pad electrodes 13a and 13b are arranged on the inner side than the RF input/output pad electrodes 11a, 11b and 11c, the control-signal pad electrodes 12a and 12b, and the power-supply pad electrode 14.

The bottom surface electrode 18 is provided on or in the bottom surface 10b of the semiconductor chip 10 (see FIG. 3B). The ground pad electrodes 13a and 13b provided on or in the top surface 10a of the semiconductor chip 10 are connected to the bottom surface electrode 18 through inner conductors that are formed inside the semiconductor chip 10.

The RF input/output lead electrodes 31a, 31b and 31c through which the RF signals are inputted and outputted, the control-signal lead electrodes 32a and 32b through which the control signals are inputted, the power-supply lead electrode 34 connected to the power supply, and the ground lead electrodes 33a and 33b connected to the ground are formed on or in the principal surface 30a of the substrate 30.

The ground wire 53a is a shield wire connected to the ground, and it connects the ground pad electrode 13a and the ground lead electrode 33a. The ground wire 53b is a shield wire connected to the ground, and it connects the ground pad electrode 13b and the ground lead electrode 33b. In other words, the ground wires 53a and 53b are connected to respectively the different ground pad electrodes 13a and 13b.

Also, in this modification, the control-signal pad electrodes 12a and 12b, the control-signal lead electrodes 32a and 32b, and the control signal wires 52a and 52b are disposed in a second region A2 that is one of regions on the substrate 30 partitioned by the two linear lines L1 and L2 along the extension directions of the ground wires 53a and 53b, the second region A2 being positioned on the opposite side to a first region A1 in which the RF input/output wires 51a to 51c, the RF input/output pad electrodes 11a to 11c, and the RF input/output lead electrodes 31a to 31c are disposed.

As a result, reduction of the isolation of the RF input/output pad electrodes 11a to 11c, the RF input/output lead electrodes 31a to 31c, and the RF input/output wires 51a to 51c from the control-signal pad electrodes 12a and 12b, the control-signal lead electrodes 32a and 32b, and the control signal wires 52a and 52b can be suppressed. In other words, it is easier to reduce the mutual influences between the control circuit 26 and the switch circuit 21 than in Embodiment 1.

Also, in the switch module 1B, at least one of the ground wires 53a and 53b may not need to be connected to the ground lead electrode 33a or 33b. FIG. 10B is a plan view illustrating a positional relation in layout among the pad electrodes, the lead electrodes, and the bonding wires in another example of the switch module 1B. As illustrated in FIG. 10B, for example, one end of the ground wire 53b may be connected to the ground pad electrode 13b, and the other end thereof may be connected to another pad electrode 13c that is formed on or in the top surface 10a of the semiconductor chip 10. In that case, for example, other one or more pad electrodes arranged around the pad electrode 13b (for example, at least one among three pad electrodes arranged to surround the pad electrode 13a together with the pad electrode 13b in FIG. 10B) are connected to the ground.

Embodiment 3

A switch module 1C according to Embodiment 3 will be described below. The switch module 1C according to Embodiment 3 is different from the switch module according to Embodiment 2 in that a ground wire 53c is disposed between the RF input/output wire 51c and the RF input/output wire 51b.

Figure 11:
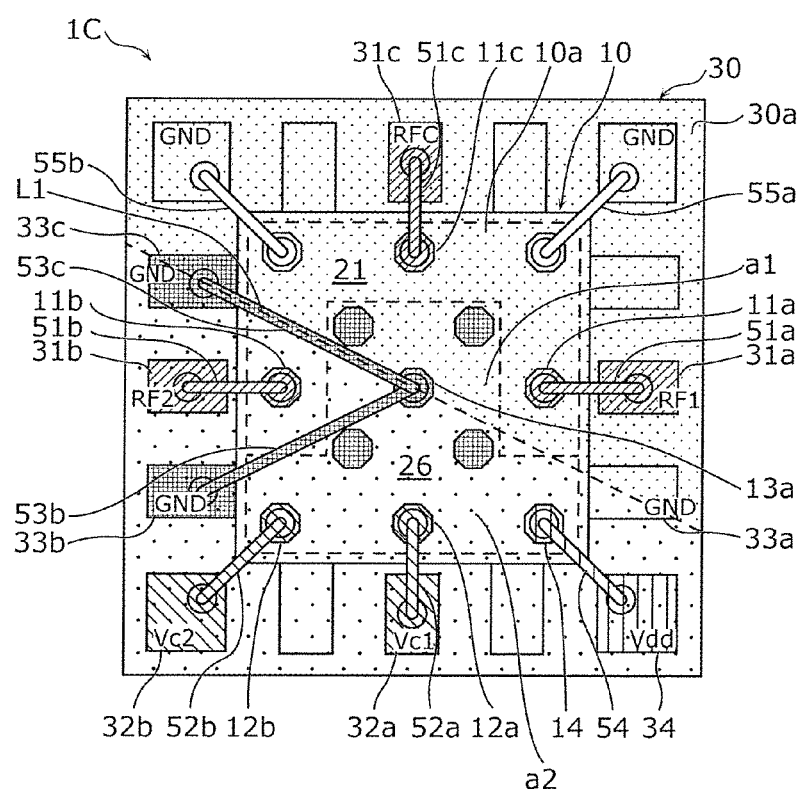
FIG. 11 is a plan view illustrating a positional relation in layout among pad electrodes, lead electrodes, and bonding wires in a switch module according to Embodiment 3.

FIG. 11 is a plan view illustrating a positional relation in layout among pad electrodes, lead electrodes, and bonding wires in the switch module 1C.

The RF input/output pad electrodes 11a, 11b and 11c through which the RF signals are inputted and outputted, the control-signal pad electrodes 12a and 12b through which the control signals are inputted, the power-supply pad electrode 14 connected to the power supply, and the ground pad electrode 13a connected to the ground are formed on or in the top surface 10a of the semiconductor chip 10.

The RF input/output lead electrodes 31a, 31b and 31c through which the RF signals are inputted and outputted, the control-signal lead electrodes 32a and 32b through which the control signals are inputted, the power-supply lead electrode 34 connected to the power supply, and the ground lead electrodes 33b and 33c connected to the ground are formed on or in the principal surface 30a of the substrate 30.

The substrate 30 has a rectangular shape when looking at the substrate 30 from the side facing the principal surface 30a. The control-signal lead electrodes 32a and 32b, the power-supply lead electrode 34, and the ground lead electrodes 33b and 33c are formed along the outer periphery of the substrate 30 so as to surround the semiconductor chip 10 that is mounted to position on the inner side of the substrate 30.

The control-signal lead electrodes 32a and 32b and the power-supply lead electrode 34 are arranged along one of four sides of the substrate 30 when viewed from the side facing the principal surface 30*a*. The RF input/output lead electrodes 31*a*, 31*b* and 31*c* are arranged along other sides different from the above-mentioned one side of the substrate 30 when viewed from the side facing the principal surface 30*a*.

The ground lead electrode 33*b* is arranged at a position along another side different from the above-mentioned one side of the substrate 30 when viewed from the side facing the principal surface 30*a*, the position being located between the RF input/output lead electrode 31*b* and the control-signal lead electrode 32*b*. The ground lead electrode 33*c* is arranged at a position along the same side of the four sides of the substrate 30 as the one side in which the ground lead electrode 33*b* is disposed, when viewed from the side facing the principal surface 30*a*, the position being located on the opposite side to the ground lead electrode 33*b* when viewed from the RF input/output lead electrode 31*b*.

The bonding wires 51*a*, 51*b*, 51*c*, 52*a*, 52*b*, 53*b*, 53*c*, 54, 55*a* and 55*b* are linear members formed by a wire bonding machine. Among those bonding wires, the bonding wires connected to the predetermined ground are called the ground wires 53*b* and 53*c*.

The ground wire 53*b* is a shield wire connected to the ground, and it connects the ground pad electrode 13*a* and the ground lead electrode 33*b*. The ground wire 53*c* is a shield wire connected to the ground, and it connects the ground pad electrode 13*a* and the ground lead electrode 33*c*. The ground wires 53*b* and 53*c* are connected to the same ground pad electrode 13*a*.

When looking at the switch module 1C from the side facing the principal surface 30*a* of the substrate 30 and assuming a linear line along an extension direction of the ground wire 53*c* to be a linear line L1, a region on the substrate 30 is partitioned by the linear line L1 defining a boundary into a region a1 (region denoted by dense dots) and a region a2 (region denoted by sparse dots).

Paying attention to, among the electrodes and the bonding wires through which the RF signals are inputted and outputted, the pad electrodes, the lead electrodes, and the bonding wires on the reception path side, the RF input/output wire 51*a*, the RF input/output pad electrode 11*a*, and the RF input/output lead electrode 31*a* are disposed in the region a1. Furthermore, paying attention to, among the electrodes and the bonding wires connected to the control circuit 26, the pad electrodes, the lead electrodes, and the bonding wires through which the control signals are inputted, the control-signal pad electrodes 12*a* and 12*b*, the control-signal lead electrodes 32*a* and 32*b*, and the control signal wires 52*a* and 52*b* are disposed in the region a2.

As described above, in this embodiment, the control-signal pad electrodes 12*a* and 12*b*, the control-signal lead electrodes 32*a* and 32*b*, and the control signal wires 52*a* and 52*b* are disposed in the region a2 on the opposite side, with respect to the boundary defined by the linear line L1 along the extension direction of the ground wire 53*c*, to the region a1 in which the RF input/output wire 51*a*, the RF input/output pad electrode 11*a*, and the RF input/output lead electrode 31*a* are disposed.

As a result, reduction of the isolation of the RF input/output pad electrode 11*a*, the RF input/output lead electrode 31*a*, and the RF input/output wire 51*a* from the control-signal pad electrodes 12*a* and 12*b*, the control-signal lead electrodes 32*a* and 32*b*, and the control signal wires 52*a* and 52*b* can be suppressed. Hence the isolation between the switch circuit 21 and the control circuit 26 can be enhanced.

An evaluation result of the isolation in the switch module 1C having the above-described structure will be described below. A method of measuring a harmonic distortion in relation to the isolation is the same as that described in Embodiment 1.

Figure 12:
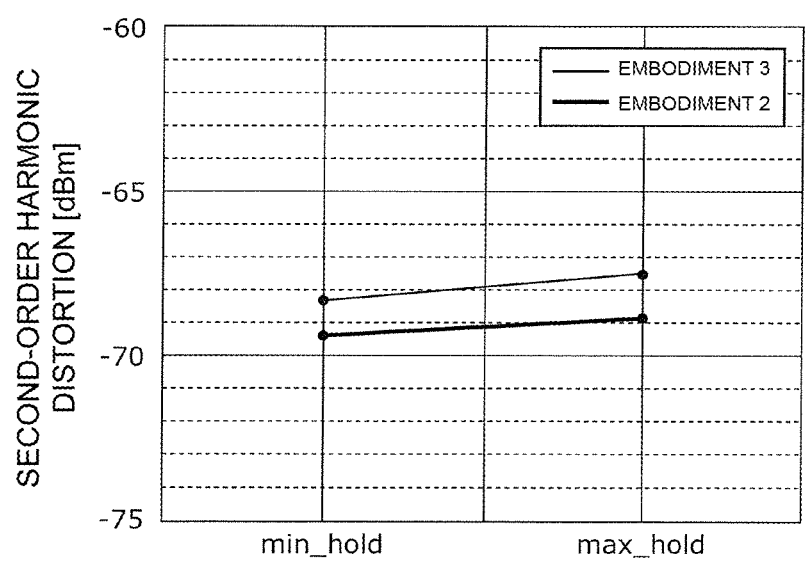
FIG. 12 depicts a second-order harmonic distortion generated in the switch module according to Embodiment 3.

FIG. 12 depicts a second-order harmonic distortion generated in the switch module 1C.

As seen from FIG. 12, in the switch module 1C according to Embodiment 3, the minimum value of the second-order harmonic distortion is −68.3 dBm, the maximum value is −67.5 dBm, and the range is 0.9 dBm. For example, when the mounting conditions are changed in a switch module that does not include the ground wires 53*b* and 53*c* each serving as the shield wire, the range of the second-order harmonic distortion is 2.6 dBm or more. The range of the harmonic distortion in the switch module 1C is reduced in comparison with that in the above case.

(Other Modifications)

While the switch modules according to the embodiments of the present disclosure and their modifications have been described above, the present disclosure is not limited to the specific embodiments and their modifications. Other embodiments resulted from not only variously altering the specific embodiments and their modifications by those skilled in the art, but also combining constituent elements used in the different embodiments and their modifications may also fall within the scope of one or more forms of the present disclosure insofar as the other embodiments do not depart from the gist of the present disclosure.

While Embodiment 1 represents the case in which the ground wire 53*a* is disposed between the ground pad electrode 13*a* and the ground lead electrode 33*a*, a ground wire may be disposed instead between the ground pad electrode 13*a* and the ground lead electrode 33*b* (see FIG. 7). In that case, the control-signal pad electrodes 12*a* and 12*b*, the control-signal lead electrodes 32*a* and 32*b*, and the control signal wires 52*a* and 52*b* are disposed in a region on the opposite side, with respect to a boundary defined by a linear line along an extension direction of the above-mentioned ground wire, to a region in which the RF input/output wire 51*b*, the RF input/output pad electrode 11*b*, and the RF input/output lead electrode 31*b* are disposed. As a result, reduction of the isolation of the RF input/output pad electrode 11*b*, the RF input/output lead electrode 31*b*, and the RF input/output wire 51*b* from the control-signal pad electrodes 12*a* and 12*b*, the control-signal lead electrodes 32*a* and 32*b*, and the control signal wires 52*a* and 52*b* can be suppressed.

While, in Embodiment 1, one ground wire 53*a* is disposed between the RF input/output wire 51*a* and the control signal wire 52*a*, the present disclosure is not limited to that case and two ground wires 53*a* may be disposed between the RF input/output wire 51*a* and the control signal wire 52*a*.

While, in the above embodiments, the RF signal of 5 GHz band is used as the RF signal that is inputted to and outputted from the switch module, the present disclosure is not limited to that case. The RF signal inputted to and outputted from the switch module may be, for example, an RF signal of 4.2 GHz band specified in the IEEE802.11 standards. Alternatively, the RF signal may be an RF signal of any suitable frequency band specified in other communication standards such as WiMAX (registered trademark) or LTE (registered trademark).

While, in the above embodiments, the path connecting the antenna common terminal 101 and the amplifier circuit 105 is assumed to be the reception path and the path connecting the antenna common terminal 101 and the amplifier circuit 106 is assumed to be the transmission path, the present disclosure is not limited to that case. For example, the reception path and the transmission path may be reversed from the above embodiments. Alternatively, both the paths may be transmission and reception paths, or reception paths, or transmission paths.

The present disclosure can be utilized, as the switch module capable of suppressing reduction of isolation, in a wide variety of communication apparatuses.

1, 1A, 1B, 1C switch module
10 semiconductor chip
10a top surface
10b bottom surface
11a, 11b, 11c RF input/output pad electrode (pad terminal)
12a, 12b control-signal pad electrode
13a, 13b ground pad electrode
13c pad electrode
14 power-supply pad electrode
18 bottom surface electrode
21 switch circuit
23, 24 switch
23a, 24a one terminal
23b, 24b the other terminal
26 control circuit
30 substrate
30a principal surface
31a, 31b, 31c RF input/output lead electrode (lead terminal)
32a, 32b control-signal lead electrode
33a, 33b, 33c ground lead electrode
34 power-supply lead electrode
51a, 51b, 51c RF input/output wire (bonding wire)
52a, 52b control signal wire (bonding wire)
53a, 53b, 53c ground wire (bonding wire)
54 power-supply wire (bonding wire)
55a, 55b connection wire (bonding wire)
68 conductive bonding material
101 antenna common terminal
102 antenna element
103, 104 filter
105, 106 amplifier circuit
107 RFIC
109 communication device
a1, a2 region
A1 first region
A2 second region
L1, L2 linear line
na, nb, nc node
Ta1, Ta2, Ta3, Tb1, Tb2, Tb3 transistor

The invention claimed is:

1. A switch module comprising a semiconductor chip that includes a switch circuit and a control circuit controlling the switch circuit, and a substrate to which the semiconductor chip is mounted,
wherein:
at least two RF input/output lead electrodes through which RF signals are inputted and outputted, and a control-signal lead electrode through which a control signal is inputted are provided on or in a principal surface of the substrate,
at least two RF input/output pad electrodes through which the RF signals are inputted and outputted, a control-signal pad electrode through which the control signal is inputted, and a ground pad electrode connected to a ground are provided on or in a top surface of the semiconductor chip,
the at least two RF input/output pad electrodes are connected to the switch circuit,
the control-signal pad electrode and the ground pad electrode are connected to the control circuit,
the switch module further comprises:
at least two RF input/output wires that are bonding wires connecting the at least two RF input/output pad electrodes and the at least two RF input/output lead electrodes in a one-to-one relation;
a control signal wire that is a bonding wire connecting the control-signal pad electrode and the control-signal lead electrode; and
a ground wire that is a bonding wire connected to the ground pad electrode, and
when looking at the switch module from a principal surface side of the substrate,
the control-signal pad electrode, the control-signal lead electrode, and the control signal wire are disposed in a region on an opposite side, with respect to a boundary defined by a linear line along an extension direction of the ground wire, to a region in which at least one of the at least two RF input/output wires, the RF input/output pad electrode connected to at least one RF input/output wire, or the RF input/output lead electrode connected to the at least one RF input/output wire are disposed.

2. The switch module according to claim 1, wherein a ground lead electrode connected to the ground is further provided on or in the principal surface of the substrate, and the ground wire connects the ground pad electrode and the ground lead electrode.

3. The switch module according to claim 1, wherein the switch circuit includes a plurality of switches each having a first terminal and a second terminal,
the second terminals of the plurality of switches are not connected to each other, and the first terminals of the plurality of switches are connected to each other,
the number of the RF input/output pad electrodes is three or higher,
one of at least three RF input/output pad electrodes is connected to the first terminal side of the plurality of switches,
at least two of the at least three RF input/output pad electrodes, the at least two RF input/output pad electrodes being not connected to the first terminal side of the plurality of switches, are connected to the second terminals of the plurality of switches, respectively,
the number of the RF input/output lead electrodes is three or higher,
the number of the RF input/output wires is three or higher, and
the at least three RF input/output wires connect the at least three RF input/output pad electrodes and the at least three RF input/output lead electrodes in a one-to-one relation.

4. The switch module according to claim 1, wherein, when looking at the switch module from a principal surface side of the substrate,
at least one of the ground pad electrode or the ground wire is disposed between the at least one RF input/output pad electrode and the control-signal pad electrode, between the at least one RF input/output lead electrode and the control-signal lead electrode, and between the at least one RF input/output wire and the control signal wire.

5. The switch module according to claim 1, wherein a power-supply lead electrode connected to a power supply is further provided on or in the principal surface of the substrate,
- a power-supply pad electrode connected to the power supply is further provided on or in the top surface of the semiconductor chip,
- the power-supply pad electrode is connected to the control circuit,
- the switch module further comprises a power-supply wire that is a bonding wire connecting the power-supply pad electrode and the power-supply lead electrode, and
- when looking at the switch module from the principal surface side of the substrate,
- the power-supply pad electrode, the power-supply lead electrode, and the power-supply wire are disposed in the region on the opposite side.

6. The switch module according to claim 5, wherein, when looking at the switch module from the principal surface side of the substrate,
- at least one of the ground pad electrode or the ground wire is disposed between the at least one RF input/output pad electrode and the power-supply pad electrode, between the at least one RF input/output lead electrode and the power-supply lead electrode, and between the at least one RF input/output wire and the power-supply wire.

7. The switch module according to claim 5, wherein, when looking at the semiconductor chip from the top surface side,
- the semiconductor chip has a rectangular shape,
- the control-signal pad electrode and the power-supply pad electrode are arranged along one of four sides of the semiconductor chip, and
- at least one of the at least two RF input/output pad electrodes is arranged along another side of the semiconductor chip different from the one side.

8. The switch module according to claim 7, wherein the at least two RF input/output pad electrodes are all arranged along sides of the semiconductor chip other than the one side thereof when looking at the semiconductor chip from the top surface side.

9. The switch module according to claim 5, wherein, when looking at the semiconductor chip from the top surface side,
- the ground pad electrode is positioned on the inner side from at least one of the at least two RF input/output pad electrodes, the control-signal pad electrode, or the power-supply pad electrode.

10. The switch module according to claim 1, wherein a bottom surface electrode connected to the ground pad electrode is provided on or in a bottom surface of the semiconductor chip,
- the semiconductor chip is mounted to the substrate with a conductive bonding material, and
- the bottom surface electrode is connected to the ground through the conductive bonding material.

11. The switch module according to claim 10, wherein the bottom surface electrode is connected to the ground through a wiring provided on or in the substrate.

12. A switch module comprising a semiconductor chip that includes a switch circuit and a control circuit controlling the switch circuit, and a substrate to which the semiconductor chip is mounted,
wherein:
- at least two RF input/output lead electrodes through which RF signals are inputted and outputted, and a control-signal lead electrode through which a control signal is inputted are provided on or in a principal surface of the substrate,
- at least two RF input/output pad electrodes through which the RF signals are inputted and outputted, a control-signal pad electrode through which the control signal is inputted, and at least one ground pad electrode connected to the ground is provided on or in a top surface of the semiconductor chip,
- the at least one RF input/output pad electrode is connected to the switch circuit,
- the control-signal pad electrode and the ground pad electrodes are connected to the control circuit,
- the switch module further comprises:
- at least two RF input/output wires that are bonding wires connecting the at least two RF input/output pad electrodes and the at least two RF input/output lead electrodes in a one-to-one relation;
- a control signal wire that is a bonding wire connecting the control-signal pad electrode and the control-signal lead electrode; and
- at least two ground wires that are bonding wires connected to the at least one ground pad electrode, and
- when looking at the switch module from a principal surface side of the substrate,
- the control-signal pad electrode, the control-signal lead electrode, and the control signal wire are disposed in a second region that is one of regions on the switch module when viewed from the principal surface side, the regions being partitioned by at least two linear lines along extension directions of the at least two ground wires, the second region being different from a first region in which at least one of the at least two RF input/output wires, the RF input/output pad electrode connected to the at least one RF input/output wire, and the RF input/output lead electrode connected to the at least one RF input/output wire are disposed.

13. The switch module according to claim 12, wherein at least two ground lead electrodes connected to the ground are further provided on or in the principal surface of the substrate, and
- the at least two ground wires connect the ground pad electrodes and the at least two ground lead electrodes in a one-to-one relation.

14. The switch module according to claim 13, wherein the at least two ground pad electrodes are provided on or in the top surface of the semiconductor chip, and
- the at least two ground wires connect the at least two ground pad electrodes and the at least two ground lead electrodes in a one-to-one relation.

15. The switch module according to claim 12, wherein the switch circuit includes a plurality of switches each having a first terminal and a second terminal,
- the second terminals of the plurality of switches are not connected to each other, and the first terminals of the plurality of switches are connected to each other,
- the number of the RF input/output pad electrodes is three or higher,
- one of at least three RF input/output pad electrodes is connected to the first terminal side of the plurality of switches,
- at least two of the at least three RF input/output pad electrodes, the at least two RF input/output pad electrodes being not connected to the first terminal side of the plurality of switches, are connected to the second terminals of the plurality of switches, respectively, the number of the RF input/output lead electrodes is three or higher, the number of the RF input/output wires is three or higher, and the at least three RF input/output wires connect the at least three RF input/output pad electrodes and the at least three RF input/output lead electrodes in a one-to-one relation.

16. The switch module according to claim 12, wherein, when looking at the switch module from a principal surface side of the substrate, at least one of the ground pad electrode or the ground wire is disposed between the at least one RF input/output pad electrode and the control-signal pad electrode, between the at least one RF input/output lead electrode and the control-signal lead electrode, and between the at least one RF input/output wire and the control signal wire.

17. The switch module according to claim 12, wherein a power-supply lead electrode connected to a power supply is further provided on or in the principal surface of the substrate, a power-supply pad electrode connected to the power supply is further provided on or in the top surface of the semiconductor chip, the power-supply pad electrode is connected to the control circuit, the switch module further comprises a power-supply wire that is a bonding wire connecting the power-supply pad electrode and the power-supply lead electrode, and when looking at the switch module from the principal surface side of the substrate, the power-supply pad electrode, the power-supply lead electrode, and the power-supply wire are disposed in the second region.

18. The switch module according to claim 17, wherein, when looking at the semiconductor chip from the top surface side, the ground pad electrode is positioned on the inner side from at least one of the at least two RF input/output pad electrodes, the control-signal pad electrode, or the power-supply pad electrode.

19. The switch module according to claim 12, wherein a bottom surface electrode connected to the ground pad electrode is provided on or in a bottom surface of the semiconductor chip, the semiconductor chip is mounted to the substrate with a conductive bonding material, and the bottom surface electrode is connected to the ground through the conductive bonding material.

20. The switch module according to claim 12, wherein the at least two ground pad electrodes are provided on or in the top surface of the semiconductor chip, and the at least two ground wires are connected to respectively the at least two ground pad electrodes.

* * * * *